United States Patent [19]
Yonemoto

[11] Patent Number: 5,386,150
[45] Date of Patent: Jan. 31, 1995

[54] TRACKING PULSE GENERATOR AND RAM WITH TRACKING PRECHARGE PULSE GENERATOR

[75] Inventor: Ryuji Yonemoto, San Jose, Calif.

[73] Assignee: Fujitsu Limited, Kawasaki, Japan

[21] Appl. No.: 795,103

[22] Filed: Nov. 20, 1991

[51] Int. Cl.⁶ .......................... H03K 5/13; G11C 8/00
[52] U.S. Cl. .................... 327/141; 327/262; 327/276; 327/263
[58] Field of Search ............ 307/269, 265, 480, 603, 307/608; 328/63; 365/233, 203

[56] References Cited

U.S. PATENT DOCUMENTS

| | | | |
|---|---|---|---|
| 3,075,089 | 1/1963 | Maley | 307/265 |
| 3,996,481 | 12/1976 | Chu et al. | 307/262 |
| 4,135,160 | 1/1979 | Gagliani | 328/58 |
| 4,467,456 | 8/1984 | Oritani | 365/190 |
| 4,558,435 | 12/1985 | Hsieh | 365/203 |
| 4,583,008 | 4/1986 | Grugett | 307/265 |
| 4,769,791 | 9/1988 | Liou et al. | 365/203 |
| 4,794,570 | 12/1988 | Rose et al. | 365/203 |
| 4,857,868 | 8/1989 | Robb | 307/480 |
| 4,899,066 | 2/1990 | Aikawa et al. | 365/203 |
| 4,903,235 | 2/1990 | Kubota et al. | 365/203 |
| 4,943,952 | 7/1990 | Terayama | 365/203 |
| 4,973,865 | 11/1990 | Haq | 307/603 |
| 5,029,135 | 7/1991 | Okubo | 365/203 |
| 5,054,002 | 10/1991 | Ninomiya et al. | 365/233 |
| 5,083,047 | 1/1992 | Horie et al. | 307/465 |
| 5,172,010 | 12/1992 | Montegari | 307/265 |
| 5,208,783 | 5/1993 | Ninomiya et al. | 365/233 |

FOREIGN PATENT DOCUMENTS 0344632 6/1989 European Pat. Off. .
2226721 4/1990 United Kingdom .

Primary Examiner—Timothy P. Callahan
Assistant Examiner—Toan Tran
Attorney, Agent, or Firm—Christie, Parker & Hale

[57] ABSTRACT

A memory has at least one decoder responsive to a synchronizing pulse for providing a selection signal to the memory cells coincident with the partial selection signal for thereby selecting a group of memory cells for an operation. The decoder has a variable time delay characteristic between the synchronizing pulse and the selection signal. The pulse generator has a mimicking circuit responsive to the synchronizing pulse for providing the partial selection signal to the group of memory cells. The mimicking circuit provides a time delay characteristic between the receipt of the synchronizing pulse and the partial selection signal which mimics the variable delay characteristic of the at least one decoder.

9 Claims, 13 Drawing Sheets

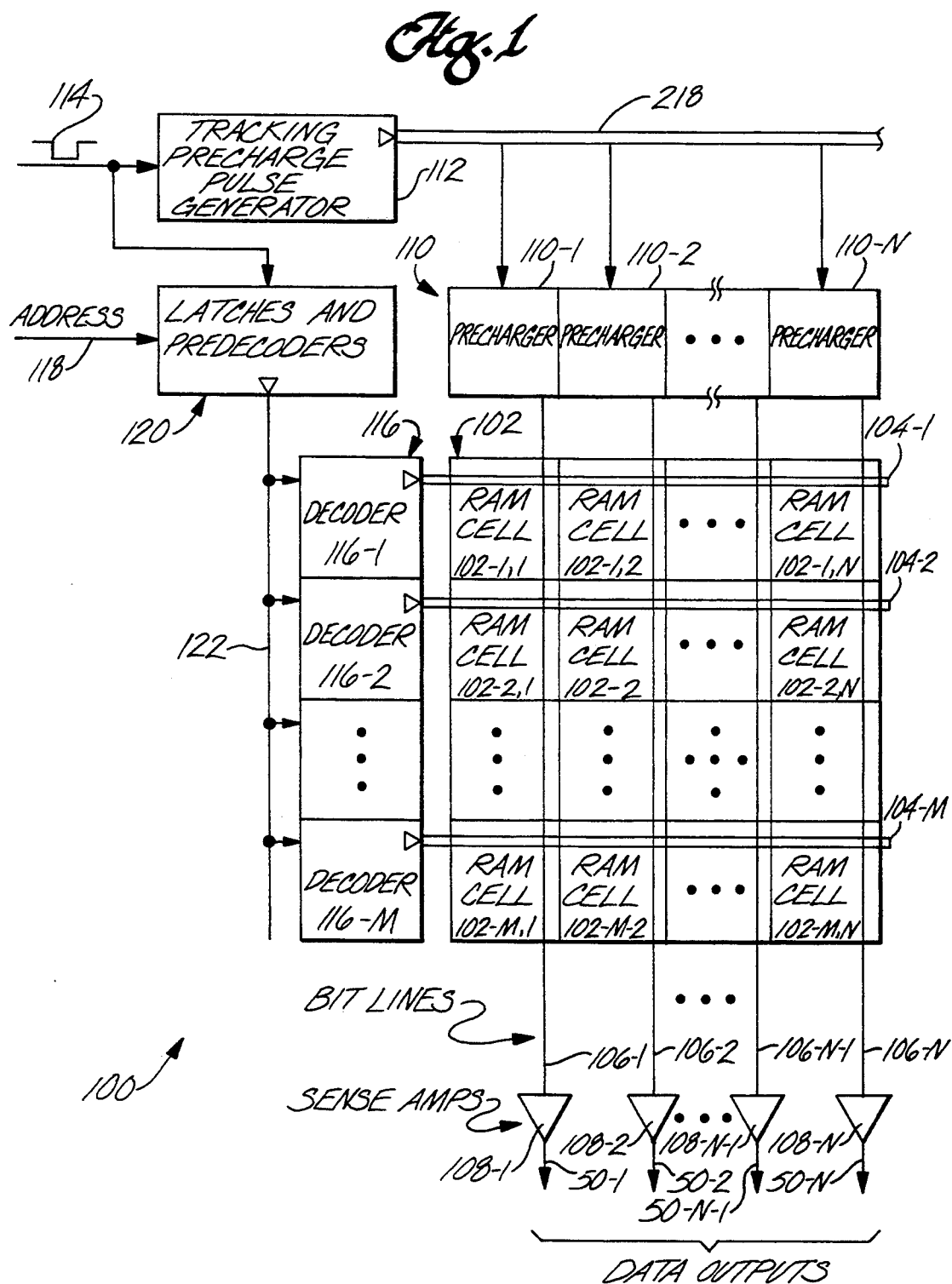

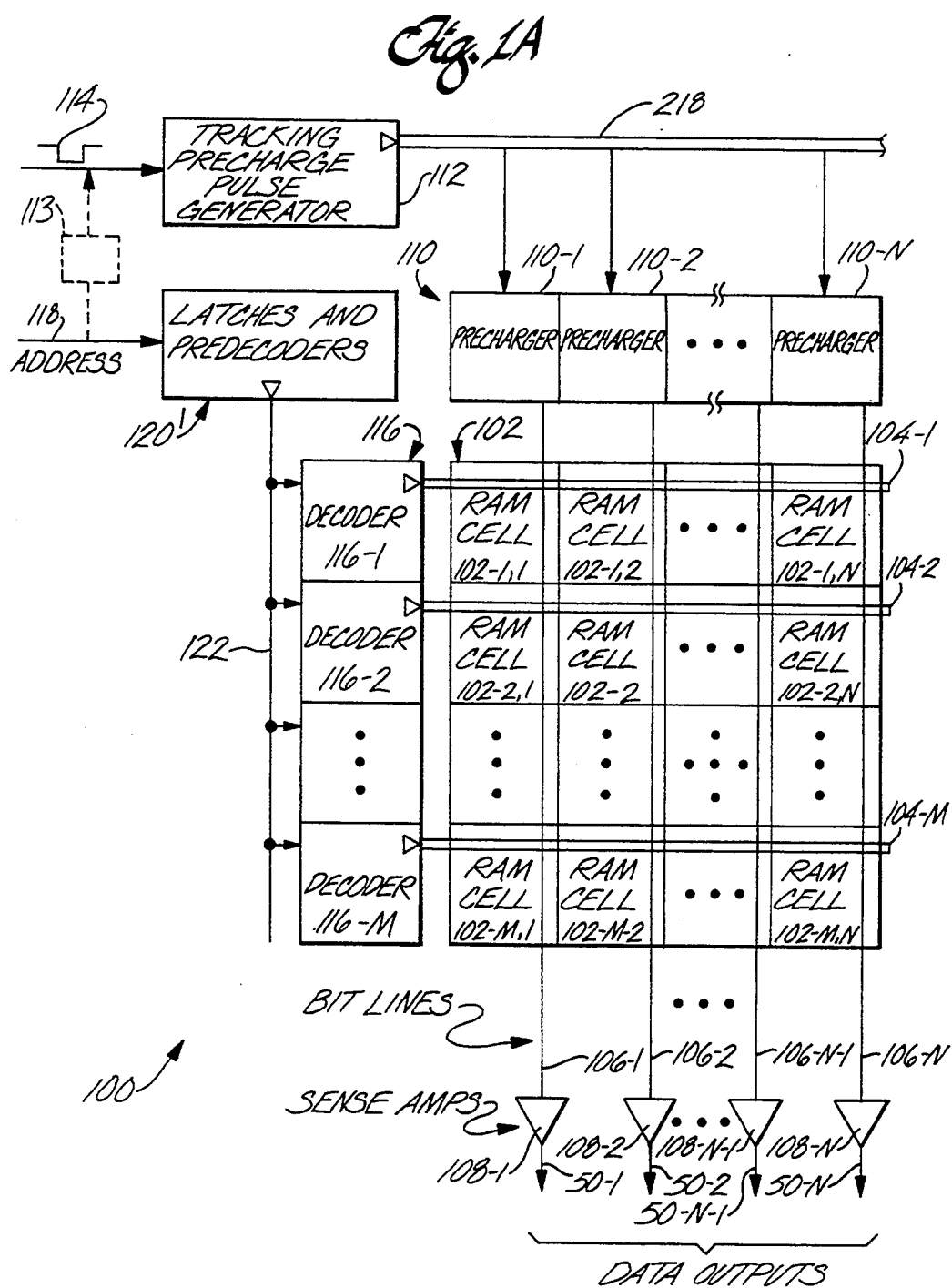

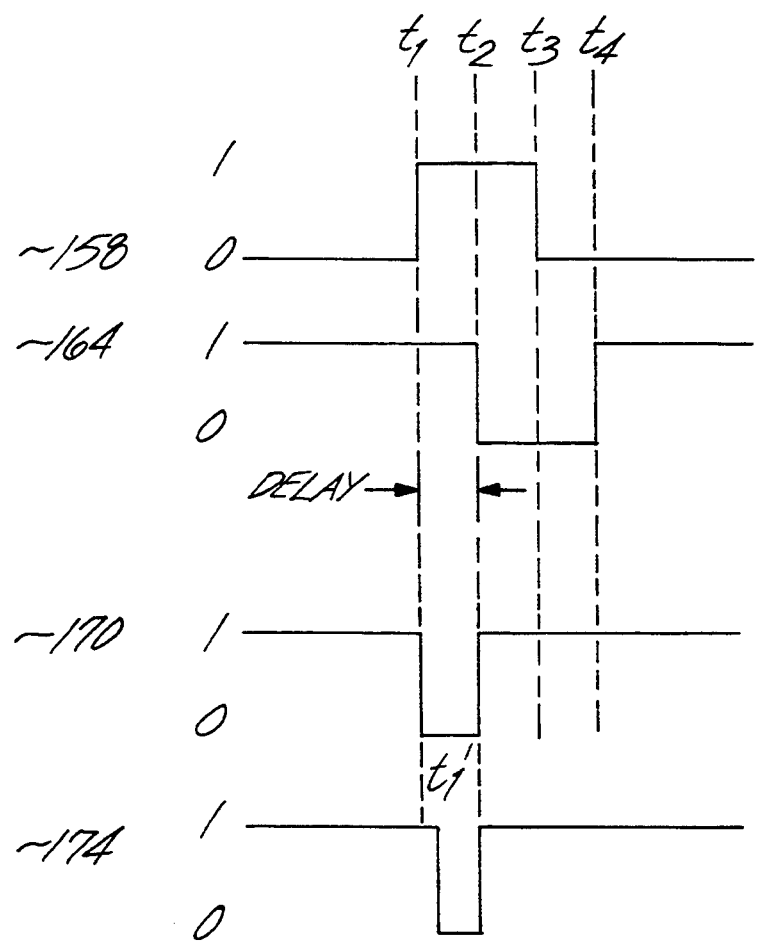

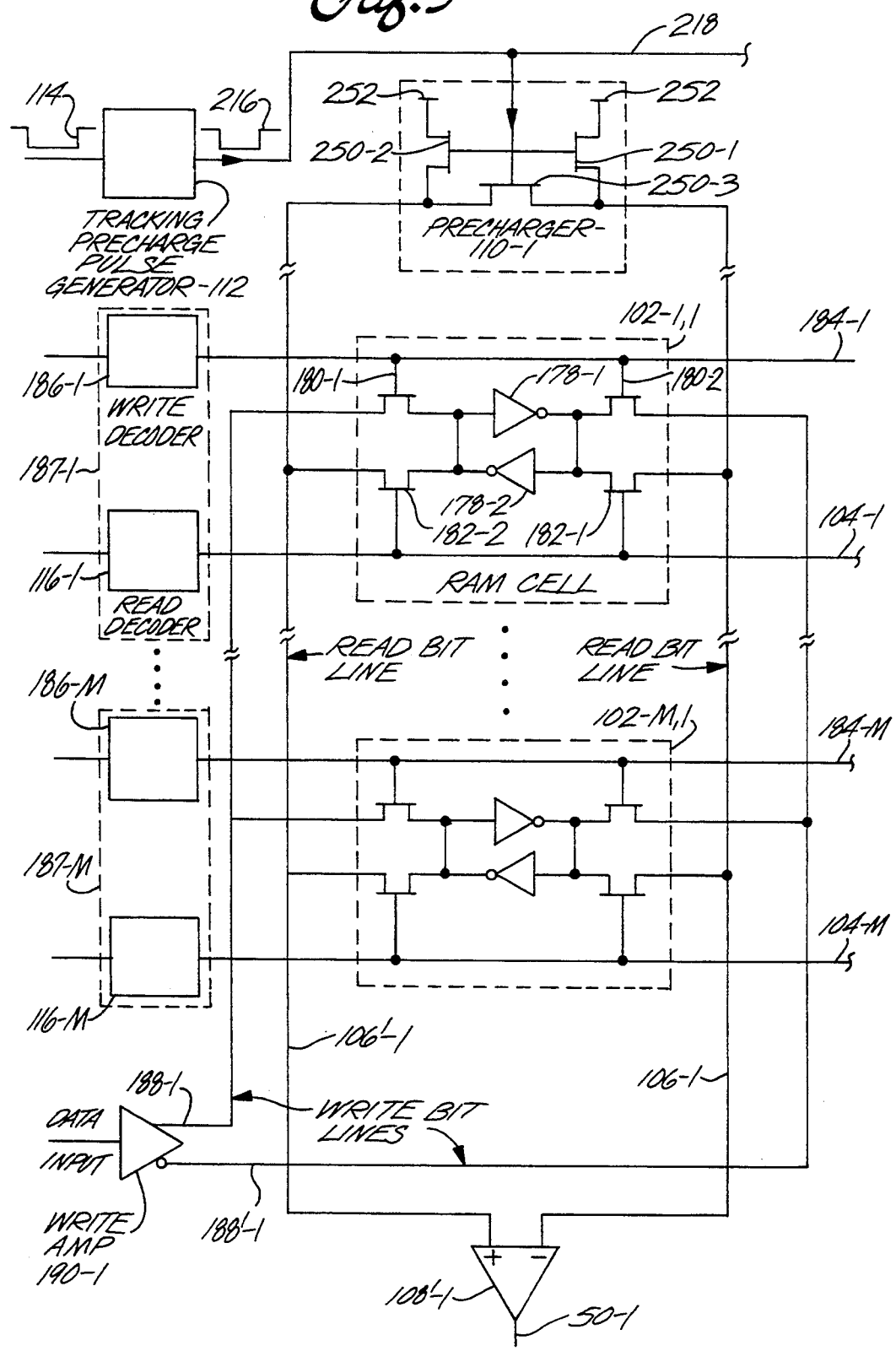

TRACKING PULSE GENERATOR AND RAM WITH TRACKING PRECHARGE PULSE GENERATOR

FIELD OF THE INVENTION

This invention relates to tracking pulse generators and more particularly to random access memories with tracking precharge pulse generators.

BACKGROUND OF THE INVENTION

In many asynchronous circuits it is desirable that the delay characteristics of one circuit closely track or vary in a certain relationship to that of another. For most devices, the delay characteristics change over temperature, process and supply voltage variations. In medium scale integration (MSI), the two circuits are designed using separate integrated circuit (IC) devices. In this technology it is necessary that a designer account for these variations in the delay of the individual IC devices.

Although the two circuits are designed on a single IC in very large scale integration (VSLI), the delay characteristics of the two circuits may not necessarily track. For application specific integrated circuits (ASIC), the problem of tracking is further compounded when the device is compilable because performance of the circuit may depend on the aggregate size of the compiled device. In compilable ASICs, the user of the IC defines the memory requirements of the IC. In particular, the memory size, e.g., the number of rows and columns of memory cells as discussed below, are defined. In many ASIC designs, the elements of the memory, such as memory cells, sense amplifiers (amps), or decoders, all of which are discussed below, are prearranged as "tiles" within the IC. After the user defines the requirements of the IC, the interconnections between the "tiles" are compiled by software that determines the interconnections and routes them. Because standard drive circuitry "tiles", e.g., precharge pulse generators, have predetermined timing characteristics, the timing of the "tile" varies as the memory size varies, because the load on the "tile" varies. Thus, a precharge pulse generator "tile" designed to provide a pulse at a given time generates a pulse at different times for different memories.

Traditionally, two circuits are designed to track each other by designing the circuits for worst case timing, thereby sacrificing performance under other conditions. However, the increasing demands on system throughput require improved performance. Worst case timing designs do not satisfy the new performance demands.

FIG. 9A is a schematic of a prior art pulse generator or chopper circuit. The chopper circuit is designed to produce a pulse that ends at a time coincident with the edge of a pulse in an output of a second circuit. FIG. 9B is the timing waveforms of the pulse generator. A chopper circuit 10 has a two-input NAND GATE 12 that is enabled by a clock 14 on a first input. The second input of the NAND GATE is the delayed clock or output 22 of a chain of an odd number of inverters 16. As will be discussed below, any odd number of inverters may be chosen so that the desired output 18 has a pulse width 20 that is determined by the delay time through the chain of inverters. For simplicity, three serially connected inverters 16-1, 16-2, and 16-3 are shown with the clock 14 inputted into the inverter 16-1. The delayed clock 22, the output of the inverter 16-3, is inputted into the second input of the NAND GATE 12. Because the number of inverters is odd, the output of the inverter 16-3 has an opposite value of the clock 14 except for the time after the clock 14 switches values and before the transition propagates through the inverter chain 16.

Referring to FIG. 9B, the output 18 from the NAND GATE 12 is a logic 1 except when both inputs, the clock 14 and the delayed clock 22, are high or a logic 1. When the clock 14 makes a transition from a logic 0 to a logic 1 at time 24, both the clock 14 and the delayed clock 22 are a logic 1. This state changes the output 18 of the NAND GATE 12 to a logic 0. The transition of the clock 14 also propagates through the inverter chain 16; after a time equal to the pulse width 20, the delayed clock 22 becomes a logic 0. At this time, the clock 14 and the delayed clock 22 are a logic 1 and a logic 0, respectively. The output 18 of the NAND GATE 12 correspondingly goes to a logic 1. Thus, the transition of the clock 14 from a logic 0 to a logic 1 causes a pulse with a pulse width 20 on the output 18.

The ability of the pulse generator described above to track a second circuit raises several problems. First, the pulse width is dependent on the load on the output of the circuit, process variations in the manufacture of the gates, and other characteristics of the NAND GATE. Second, the temperature, process and voltage characteristics of the inverter or feed-back chain may prevent tracking of the delay characteristics of the second circuit. Finally, the delay of the delay circuit chain is fixed and has no provision for adjustment as the delay of the second circuit changes, although in compilable cells, the delay of the second circuit frequently changes.

FIGS. 10A and 10B are schematics of prior art open loop and closed loop chopper circuits, respectively. The open loop chopper circuit 26 shown in FIG. 10A functions in a manner similar to the prior art circuit 10 shown in FIG. 9A. A chain of delay circuits 28-1 through 28-N replaces the inverter chain 16. Any number, N, of delay circuits 28 may be used provided that the output of the delay circuit 28-N has an opposite logic value of the clock 14 after a transition in state of the clock 14 has propagated through the delay circuit chain 28. The output 18 of the NAND GATE 30 is a pulse having a pulse width equal to the delay time of the delay circuit chain 28. The delay of NAND GATE 30 can be disregarded if the delay time through the NAND GATE 30 is very small compared to the delay through the delay chain 28. Because this circuit operates similar to the chopper circuit in FIG. 9A as described above, it has similar disadvantages.

In designs where the delay through the NAND GATE 30 is not small, the closed loop chopper circuit 32 of FIG. 10B is used. In this circuit, the output 34 of the NAND GATE 36 is an input to the delay circuit chain 38 whose output is an input to the NAND GATE 36. The clock 14 is an input to the second input of the NAND GATE 36. The delay circuit chain 38 has N delay circuits 38-1 through 38-N and functions in a manner similar to the delay circuit chain 28 of chopper circuit 26. Any number, N, of delay circuits 38 may be used provided that the output of the delay circuit 38-N has the same logic value as the output 34 after a transition in state of the output has propagated through the delay circuit chain 38. The closed loop chopper circuit 32 functions in a manner similar to that of the open loop chopper circuit 26 except that, when the clock 14 makes a transition from a logic 0 to a logic 1, the output 34 is a sequence of pulses each having a pulse width equal to the delay through the delay circuit chain 38 plus that of the NAND GATE 36. This toggling between logic states will continue until the NAND GATE 36 is disabled by switching the clock 14 to a logic 0. This continuous oscillation is easily visualized. Initially clock 14 is a logic 0, the output 40 of the delay circuit 38-n is a logic 1 and output 34 is a logic 1. After the clock 14 is switched from a logic 0 to a logic 1, the NAND GATE 36 is enabled and the output 34 goes low to a logic 0. The new value of the output 34 propagates through the delay circuit chain 38 causing its output 40 to become a logic 0. The NAND GATE 36 inverts the logic 0 output 40 so that the output 34 goes high to logic 1. The logic 1 propagates through the delay circuit chain 38 and becomes inverted by the NAND GATE 36 causing a logic 1 output 34. Thus, the output 34 toggles between a logic 1 and a logic 0 state like a free-running oscillator at a frequency determined by the delay time through the delay circuit chain 38 and the NAND GATE 36. Because the closed loop chopper circuit operates as a free-running oscillator, only when clock 14 is logic 1, the circuit functions as a single pulse generator if the clock period is short enough to turn off the NAND GATE 36 before the transition loops back on itself. This circuit has similar disadvantages as the open loop chopper circuit.

In many applications it is desirable for the end of a pulse from a circuit to occur substantially coincident with the generation of a signal from a second circuit. For example, in a memory system it is desirable for the end of a precharge pulse to occur substantially simultaneous with the decoding of the memory address. The memory system will be discussed in more detail infra.

In random access memory (RAM) designs, precharging of a bit line is done to improve the access time of the memory. RAMs are typically configured in rows and columns of memory cells on a single semiconductor chip. A row of memory cells connected to a word line typically comprises a word of memory. An address decoder transmits an enabling signal to a row through a word line. A memory cell in the addressed row of memory cells is either written or read through a corresponding write or read bit line that interconnects each column of memory cells. During a memory read, the read bit line for each column will either have a high or a low voltage for a logic 1 or 0 respectively. Memories are typically designed by compacting memory cells into contiguous areas on the semiconductor chip. In order to maximize memory cell density, the driver circuit for each bit line is designed as small as possible. A sense amplifier (amp) is connected to the end of each bit line in order to amplify its signal and to provide sufficient data output drive current for circuits that receive these signals. A binary bit of information is read out of a memory cell by driving the bit line either to a high or low voltage to represent a logic 1 or logic 0, respectively. Because the signal drive capability of a memory cells is low, the transition time between logic levels is slow. In order to enhance this transition time, the voltage of each bit line is typically set at an intermediate voltage level between high and low voltage levels by a precharger which precharges the bit line so that the voltage on the bit line reaches this intermediate voltage before the address decoding is completed. When the memory cell is read by a signal on the addressed word line, the voltage swing on the precharged bit line is, on the average, about ½ the swing of a non-precharged line. Because the voltage swing is less than for a non-precharged line, the transition time is correspondingly reduced.

FIG. 11A shows the timing wave forms of the precharger, the address decoder and the data output when the precharging occurs simultaneously with the address decoding. The read decoder output 42 is a time sequence of decoded read address signals 44 corresponding to a sequence of read addresses 118. A read address 44-1 for one word line is followed by a read address 44-2 to another word line and so forth. For clarity, only two read addresses are shown. While the precharge pulse 46 on a bit line is high, the voltage on the bit line reaches an intermediate voltage level at a time coinciding with the completion of the decoding of the read address 44 and the application of the address signal on the corresponding word line. As shown in FIG. 11A, the end of the precharge pulse 46 coincides with the end of the decoding of address 44-2, or equivalently at the beginning of the address signal on the read decoder output 42. The voltage wave form of the read bit lines 48 is at the intermediate voltage level between high and low levels until a delay time after the end of the precharge pulse. The sense amp 50 detects the voltage level on the bit line and outputs a logic signal as a function of the detected voltage. When the bit line voltage is at the intermediate level, the output of the sense amp is indeterminate. A system which uses this memory cannot use the data on the output of the sense amp until it is determinable. Thus, the system cannot access memory faster than the memory can read the data. During this time, the sense amp output 50 for each bit line is in an unknown state because the read bit lines 48 are at the mid-voltage level. When the read bit lines 48 are no longer being precharged, the read bit lines are driven by the RAM cells and the sense amp forms outputs representing the data read from the read bit lines.

FIG. 11B shows the timing wave forms of the precharger, address decoder and the data output when the precharging occurs earlier than the address decoding completes and the address signal occurs on a word line. The read decoder output 42 functions as discussed above in FIG. 11A. However, FIG. 11B shows the precharge pulse 46 occurring and ending before the end of the decoding of address 44-2. During the precharge pulse, the read bit lines 48 are set to the intermediate voltage level and the sense amp output 50 is in an indeterminate state. After the precharge pulse is turned off, the address decoder is still addressing memory address 44-1 and the read bit lines 48 reestablish voltages corresponding to the data in the memory cells at the old address 44-1 and the sense amp outputs this data. If the system which uses this memory reads the data at this time, the system may not have sufficient time to read the data before the address of the memory cells being read is changed to address 44-2. This change in address causes the read bit lines 48 to change to reflect the data in the memory cells at the next read address 44-2. Thus, the sense amp output 50 has an incorrect output until sometime after the address 44-2 is decoded and the voltage on the bit lines settle to the voltages of the data located in the memory cells of address 44-2.

FIG. 11C shows the timing wave forms of the precharger address decoder and the data output when the precharging occurs after the address decoding completes. The read decoder output 42 functions as discussed above in FIG. 11A. However, FIG. 11C shows the precharged pulse 46 ending after the end of the decoding of the address 44-2. During the precharge pulse 46, the read bit lines 48 are set to the intermediate voltage level and the sense amp output 50 is in an indeterminate state. However, during part of the time that the sense amp output 50 is in an undetermined state, the address decoding of address 44-2 is completed. The memory cells at this address try to output data on each read bit line at the same time that the corresponding precharged pulses on the read bit lines are being held at the intermediate voltage level. At the end of the precharge pulses, the data on the read bit lines reflects the data in the addressed memory cells. Thus, the proper data at the memory address 44-2 to be output on the sense amp output 50 has been delayed.

Ending the precharged pulse before the address is decoded can cause the incorrect value to be output by the sense amp. A precharged pulse that ends after the address is decoded causes a delay in data access. Because most memory systems require faster data access, this is an undesirable condition.

One method for controlling the precharge pulse and the address decoding is to perform these functions consecutively. For example, U.S. Pat. No. 4,558,435 to Hsieh issued Dec. 10, 1985, teaches the sequencing of the precharging and address decoding so that the precharge is completed before initiating the address decoding. An address register transition detector generates a negative going voltage step upon the receipt of a new address. The address transition pulse causes the precharge pulse generator to generate a precharge pulse and simultaneously inhibits the address decoders. A sensing circuit monitors the voltage on the master bit lines and generates a reset pulse when the precharging is completed. This reset pulse disables the precharge pulse generator and simultaneously enables the address decoding. The completion of the address decoding is determined by detecting the return of a read enable pulse that propagates over a dummy line. The dummy line is placed on the silicon and is similar in length and composition to the word lines of the memory in order to simulate the electrical properties of the word line. Thus, the read enable pulse turns on the address decoder, and, as the decoded address propagates along the word line to enable selected memory cells, the read enable pulse also travels along this dummy line so that the read enable pulse returns to set a sense enable signal at the same time that the memory cells are ready to be read. When the sense enable pulse enables the sense amps to read data from the memory cell, the address decoders are disabled, and the system is restored to its initial position prior to the next address change.

The speed of the Hsieh memory system is limited by the cumulative time of the precharging, the address decoding and the reading from the memory cells. In addition, the propagation time through the delay line does not necessarily correspond to the delay through the address decoding circuitry.

Thus it is desirable to provide a pulse generator which produces a pulse substantially coincident with the generation of a signal from a second circuit. This coincident timing should be independent of the temperature, process or power forms of the two circuits. Furthermore, it is desirable that the circuits perform as fast as possible.

SUMMARY OF THE INVENTION

The features and advantages of the present invention which will become apparent from the detailed description of the preferred embodiments below are achieved by providing a tracking pulse generator circuit for forming a delayed output signal whose delay is a function of the delay of a second circuit.

In a preferred embodiment one embodiment of the invention is a memory on a common integrated circuit chip having a plurality of memory cells and a tracking pulse generator for applying and removing a precharge signal to the memory cells. A decoder is responsive to an initiating condition for applying a selection signal to the memory cells for thereby selecting memory cells for an operation. The decoder has a time delay characteristic between the time of the initiating condition and the time of the selection signal that may vary. The tracking pulse generator has a mimicking circuit that is responsive to the receipt of a synchronizing pulse for removing the precharge signal to the memory cells. The mimicking circuit provides a time delay characteristic between the time of the occurrence of the synchronizing pulse and the time of the removal of the precharge signal which mimics the variation in time delay characteristic of the decoder so that the removal of the precharge signal and the application of the selection signal will occur substantially coincidentally. A loading line is on the integrated circuit chip and is coupled to the decoder. Another load line is on the same integrated circuit chip coupled to the mimicking circuit for loading the mimicking circuit substantially the same as the loading on the decoder.

Another embodiment of the invention is an electrical circuit that has a first circuit having an electrical load thereon and a delay characteristic which is a function of the load and is responsive to an initiating signal for providing a first output signal delayed in time as a function of the delay characteristic. The electrical circuit further has a tracking pulse generator circuit for forming a second output signal in a predetermined time relationship with the first output signal after the occurrence of the initiating signal. The tracking pulse generator circuit has a gate and a feedback circuit coupled between an output of the gate at which the second signal is formed and an input of the gate. The gate also has an input coupled to the initiating signal. The gate and feedback circuit are characterized for generating the second output signal in response to the occurrence of the initiating signal. The gate and feedback circuit have an electrical load on the feedback circuit for mimicking the delay characteristic caused by the load on the first circuit. The gate and feedback circuit with such load comprise a mimicking delay circuit which mimics the delay characteristic for the first circuit to thereby vary the delay in time of the second output signal as a function of the delay characteristic of the first circuit.

An embodiment of the invention is also an electrical circuit wherein a second output signal is to be formed in a predetermined time relationship with a first output signal after the occurrence of an initiating signal. The electrical circuit has a first circuit having an output and an electrical load on the output. The electrical circuit is responsive to the initiating signal and has a delay characteristic which is a function at least of the load for providing the first output signal delayed in time as a function of the delay characteristic. A tracking pulse generator circuit has means for generating the second output signal and means for feeding back the second output signal to an input of the generating means. The generating means also has an input coupled to the initiating signal and a load on an output of the generating means. The generating means and the feedback means comprising means including the load for mimicking the delay characteristic of the first circuit to thereby vary the delay time between the occurrence of the initiating signal and the second output signal as a function of the delay characteristic of the first circuit.

BRIEF DESCRIPTION OF THE DRAWINGS

The foregoing features of the present invention will be better understood upon consideration of the following detailed description of certain preferred embodiments taken in conjunction with the accompanying drawings in which:

FIG. 1 is a block diagram illustrating a memory system using a tracking precharge pulse generator and embodying the present invention;

FIG. 1A is a block diagram similar to FIG. 1, except that it illustrates both an asynchronous system and a synchronous system for providing the addresses and providing the clock pulse;

FIG. 2B is a timing diagram illustrating the timing of the signals for FIGS. 2A and 2C;

FIG. 3 is a schematic of decoders, a tracking precharged pulse generator, and a precharger for one column of memory cells for the memory system of FIG. 1 where the memory is a static RAM and the outputs are differential;

FIB. 10B is a schematic of a prior art closed loop chopper circuit; and

Figure 11A:
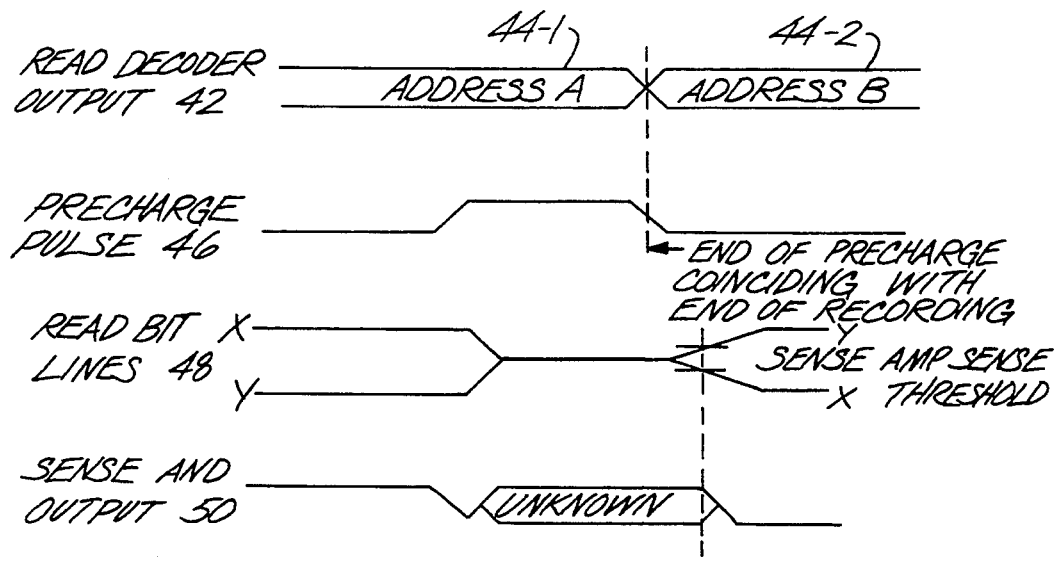
Figure 11B:
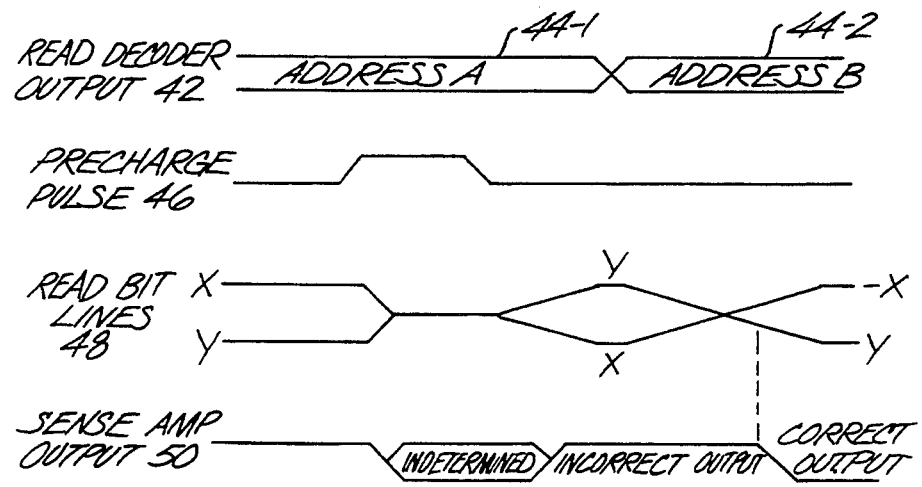
Figure 11C:
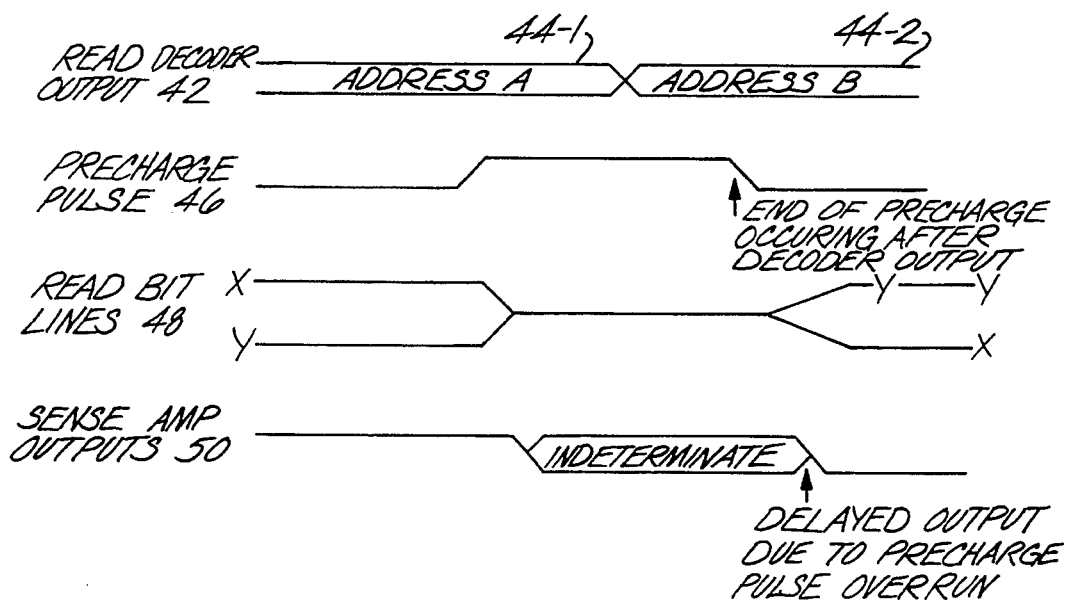

FIG. 11, including FIGS. 11A, 11B and 11C, are timing wave forms of the precharger and the address decoder showing the data output when the precharging occurs simultaneously with the address decoding (FIG. 11A), when the precharging occurs earlier than the address decoding (FIG. 11B), and when the precharging occurs after the address decoding (FIG. 11C).

DETAILED DESCRIPTION OF THE PREFERRED EMBODIMENTS

FIG. 1 is a block diagram illustrating a system using a tracking precharge pulse generator and embodying the present invention. Memory system 100 has an array of memory cells 102 preferably arranged in M rows and N columns. By way of example, several million memory cells are present, however, only a few of the cells are shown for clarity. Components of the memory system are shown exaggerated in size or disproportionate in relative size also for clarity. The memory may be either random access memory (RAM) or read only memory (ROM), although a RAM is disclosed by way of example. Furthermore, for a RAM, the memory can be a static RAM, a dynamic RAM, an Emitter Coupled Logic (ECL) RAM or a Gallium Arsenide (GAAS) RAM. The memory may also be fabricated using bipolar or non-bipolar technology.

Each RAM memory cell 102 is defined by its location in the memory by two digits that follow the numeral 102, where the first numeral gives the row number and the second the column number. For example, RAM cell 102-I,J is located in row I at column J. Those memory cells which are not shown are indicated by a series of dots.

Each of the M rows of RAM cells 102-1 through 102-M is connected by one of word lines 104-1 through 104-M so that, when the word line is enabled by an appropriate signal, the storage content of each RAM cell in the corresponding row is read out onto a corresponding bit line, or in the case of differential memory cells, a corresponding pair of bit lines. For semi-conductor memories, the word line is typically a strip of metal atop a silicon chip.

Each of the N columns of RAM cells 102-1 through 102-M is interconnected by a corresponding one (or pair) of bit lines 106-1 through 106-N so that when a row of RAM cells to be read is enabled, each RAM cell in the corresponding row outputs its data or storage content onto its corresponding bit line (or pair of bit lines). FIG. 1 illustrates a single ended memory cell in which one bit line is used per column. Each bit line 106-1 through 106-N is connected to a corresponding sense amp 108-1 through 108-N which forms an output data signal representative of the content of the memory cell which is being read. N prechargers 110-1 through 110-N are each connected to a corresponding one of bit lines 106-1 through 106-N to precharge the voltage on the corresponding bit line to a column of memory cells, before the RAM cell is read. Each precharger 110 is controlled by an individual precharge circuit in tracking precharge pulse generator 112. A clock signal 114 from a source (not shown) initiates the tracking precharge pulse generator and causes the address to be latched in circuit 120.

In the preferred embodiment, the decoding of the address 118 occurs in two stages. The first stage of the address decoding is in latches and predecoders 120. As discussed below for FIGS. 4 and 5, the latches and predecoders 120 include K/2 predecoders 120-1 through 120-K/2 and latches 213-1 through 213-K/2, where K is the number of bits in the address 118. The second stage is decoded in address decoders 116. The outputs of the predecoders 120 are connected to the address decoders 116 by vertical predecoder drive lines 122.

Each of M address decoders 116-1 through 116-M generates a voltage on a corresponding one of horizontal word lines 104-1 through 104-M, respectively. When a binary coded address 118 is received and clock 114 occurs, latches and predecoders 120 and decoders 116 generate an output signal on one word line 104 to enable one row of RAM cells to be read.

As discussed, preferably, the memory is a differential type and therefore the bit lines 106 are held at an intermediate voltage level during precharge. In order to ensure that the correct data is read from memory and to allow the bit lines to be read after the address has been decoded, the end of the precharge signal or pulse from precharger 110 must coincide with the address decoder output signal from decoders 116 for a new address. This, in turn, requires that the pulse from precharge pulse generator 112 and the decoded signal from decoder 116 after an address is latched in circuit 120 occur coincident in time after a clock pulse 114 occurs. To this end, the timing in the tracking precharge pulse generator 112 tracks or mimics the timing of the latches and predecoders 120 and the decoders 116 by mimicking the delay circuits 120 and 116.

FIG. 1A is essentially the same as FIG. 1. However, circuit 120' only contains predecoders and the latches have been eliminated. Additionally, FIG. 1A illustrates an asynchronous system where application of the addresses directly to the predecoders 120' causes address transition detector circuit 113 to generate the clock pulse 114 to the tracking pulse generator 112. Alternatively, the system of FIG. 1A may be a synchronous system where circuit 113 is eliminated and the clock pulse 114 is generated and applied to tracking pulse generator 112 in synchronism with the application of the address to predecoder 120'.

Figure 2A:
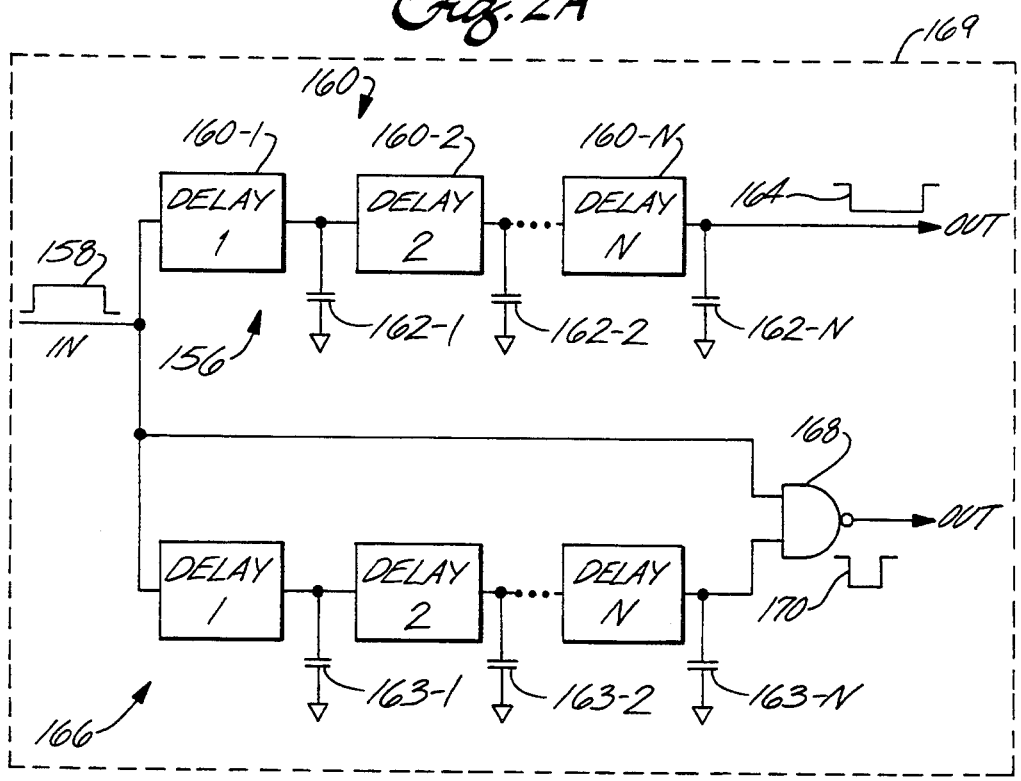
FIG. 2A is a block diagram illustrating an open loop pulse generator mimicking a reference circuit.

The tracking precharge pulse generator 112 and its mimicking characteristics will be illustrated with reference to the schematic diagrams of FIGS. 2A and 2B. FIG. 2A is a block diagrams of an open loop tracking pulse generator 166 mimicking a reference circuit 156. Both of circuits 156 and 166 receive the same input signal or pulse 158 and provide an output signals or pulses 164 and 170 respectively. Reference circuit 156 has a sequence of N delay circuits 160-1 through 160-N. The output of each delay circuit 160 is an input to the next delay circuit in the sequence. Each of delay circuits 160-1 through 160-N has a corresponding load 162-1 through 162-N connected to its output. The delayed output 164 from the delay circuit 160-N is delayed from the input signal 158 by the delay through each of delay circuits 160 with their respective loads 162. Each of loads 162-1 through 162-N represents an actual load, such as another circuit or circuits, that are driven by the corresponding delay circuit. As discussed above, the delayed output 164 will vary as a function of the temperature, process, and power forms of and loading on the reference circuit. It is desired that a tracking delay circuit track the delay of the reference circuit and, therefore, the tracking circuit should have similar and preferably identical delay characteristics to the reference circuit.

Figure 10A:
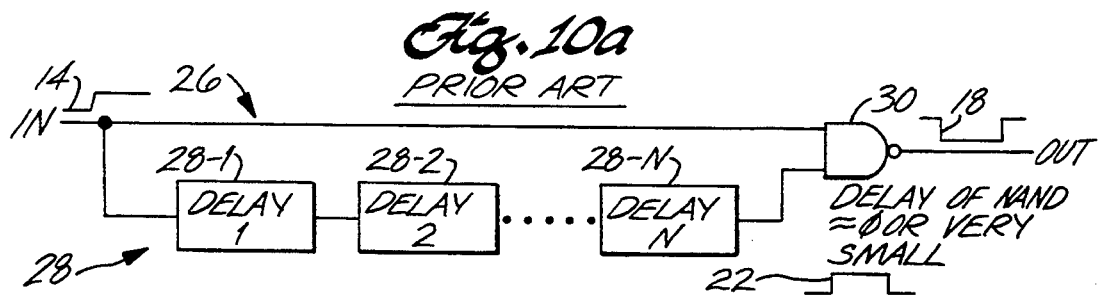
FIG. 10A is a schematic of prior art open loop pulse generator.

The open loop tracking pulse generator 166 is structured similar to the open loop chopper circuit 26 as discussed above for FIG. 10A. The delay circuit chain of the open loop pulse generator 166 has a sequence of N delay circuits 161-1 through 161-N connected to a corresponding one of loads 163-1 through 163-N, respectively. However, the tracking pulse generator of FIG. 2A differs in that a plurality of delay circuits are provided each of which is constructed essentially the same as each of a plurality Of delay circuits in the reference circuit and a load is placed on the output of each of the delay circuits which is essentially the same as the load on the output of each of the corresponding delay circuits in the reference circuit and both of the circuits are formed on a common integrated circuit chip 169'. Preferably, each of delay circuits 161-1 through 161-N is constructed on the same integrated circuit chip using an identical circuit to that of delay circuits 166-1 through 166-N, respectively, and each of loads 163-1 through 163-N is an identical circuit to loads 160-1 through 160-N, respectively. In this example, the loads are capacitive loads. The input signal 158 and the delayed output signal from the last delay circuit 161-N are inputs to a two input NAND GATE 168. The output 170 of the NAND GATE 68 has a pulse width equal to the delay through the delay chain of delay circuits 161-1 through 161-N. This assumes that the NAND GATE 168 has a small delay time in comparison with the delay through the delay circuit 161. The open loop pulse generator 166 uses the same type of components and is formed on the same semiconductor substrate or chip 169 as the reference circuit 156.

Referring to FIG. 2B, it is desired that the rising edge of the pulse 170 at t2, from the tracking pulse generator 166, track or coincide with the following edge of the pulse 164 from the reference circuit 156. The input pulse or signal at 158 goes from low or logic 0 to high or logic 1 at t1 and back to logic 0 at t3. The reference circuit causes the output 164, after its delay, to go from logic 1 to logic 0 at t2 and back to logic 1 at t4. The inputs to NAND GATE 168 at t1 are initially logic 0 from input 158 and logic 1 from delay circuits 161-N. When input 158 goes to logic 1 at t1, output 170 goes to logic 1 and after the delay through delay circuits 161-1 through 161-N, the output of delay circuit 161-N goes to logic 0 at time t2 causing output 170 from NAND GATE 168 to go from logic 0 to 1 at time t2 in coincident with the falling edge of output 164 from the reference circuit 156. Therefore, the rising edge of the pulse 170 from the tracking pulse generator 166 tracks or follows the falling edge of the pulse 164 from the reference circuit. As a result, the delay through the open loop pulse generator 166 tracks that of the reference circuit 156 with changes in temperature, process, power forms and loads on the delay circuits.

When the delay through the NAND GATE 168 is not small in comparison with the delay through the delay circuits 161, the pulses 164 and 170 may not track. However, the closed loop tracking pulse generator 172 shown in FIG. 2C will track when the delay through the NAND GATE is not small.

Figure 2C:
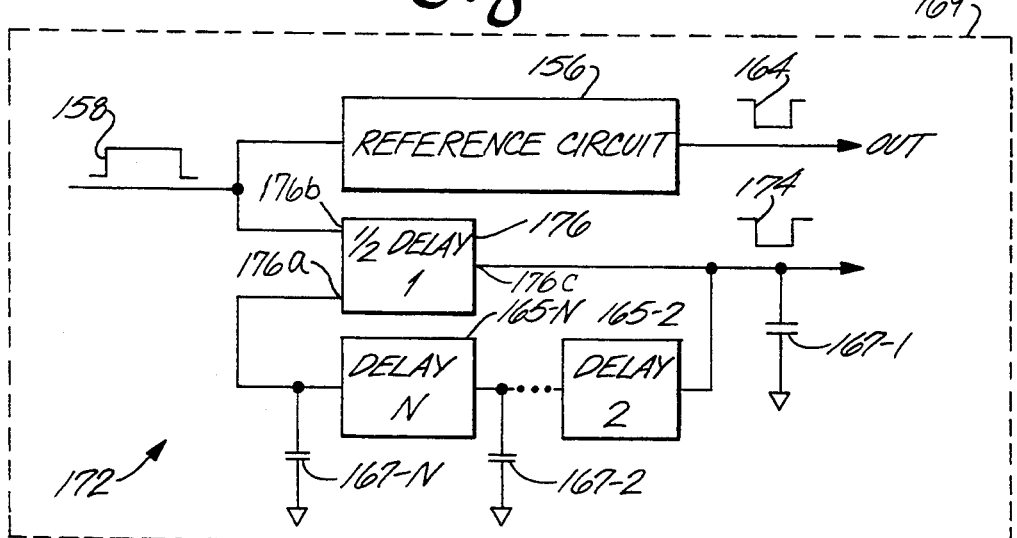
FIG. 2C is a block diagram illustrating a closed loop pulse generator mimicking a reference circuit.
Figure 10B:
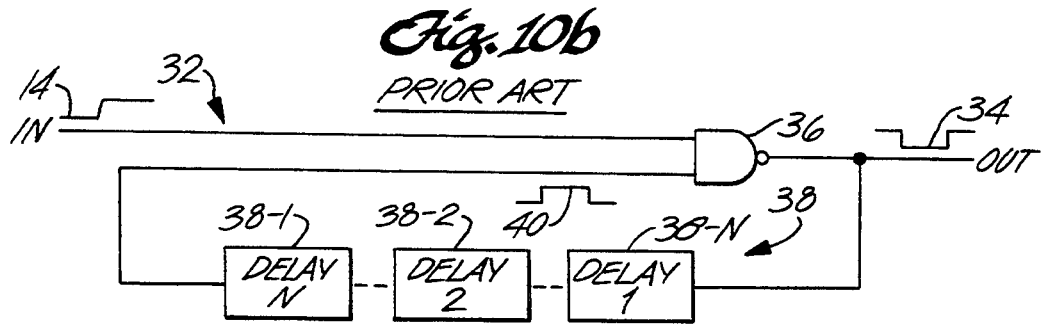

The tracking pulse generator of FIG. 2C operates similar to that discussed above for the closed loop chopper circuit shown in FIG. 10B. However, the generator of FIG. 2C differs from that of FIG. 10B in that a plurality of delay circuits are provided each of which is constructed essentially the same as each of a plurality of delay circuits in a reference circuits and a load is placed on the output of each of the delay circuits which is essentially the same as the load on the output of each of the delay circuits in the reference circuits and both the reference circuit and the tracking pulse generator are formed on a common integrated circuit chip 169'.

More specifically, the delay elements 160-2 through 160-N and their corresponding loads 162-2 through 162-N, respectively, of reference circuit 156 are replicated in the tracking pulse generator 172 with a serial chain of delay circuits 165-2 through 165-N and corresponding loads 167-2 through 169-N, respectively. However, the input to the delay circuit 165-2 is coupled to the output 176c of a two input half-delay gate 176. The output of delay circuit 165-N is input into one input 176a of the half-delay gate 176. Input signal 158 to reference circuit 156 is also an input to the second input 176b of the half-delay gate 176. The half-delay gate 176 is designed to have a delay period characteristic equal to one-half of the delay period of the delay circuit 160-1 in the reference circuit 156. The output 174 of the tracking pulse generator 172 has a pulse width about equal to that of output 164 of the reference circuit 156 and its rising edge precisely tracks or follows the falling edge of output 164 of the reference circuit 156 across temperature, process and voltage variations and with load variations.

FIG. 2B also depicts the wave form of signals 158, 164 and 174 of FIG. 2C. The pulse 174 is similar to that of 170 except that it is narrower due to the delay of half-delay gate 176. However, the rising edge of pulse 174 is coincident with the falling edge of pulse 164 from reference circuit 156 because the signal passes through half-delay gate 176 before terminating the pulse 174.

FIG. 3 is a schematic of the decoders for all memory rows, a tracking precharged pulse generator, and a precharger, memory cells using a differential bit line configuration, write amp and read amp for one column 1 of a static type RAM for use in the RAM of FIG. 1. However, single ended bit lines may also be used. Each memory cell is essentially the same and can be understood with reference to memory cells 102-1,1. RAM cell 102-1,1 has a pair of memory inverters 178-1 and 178-2 that are cross coupled so that the output of one inverter is inputted into the input of the other inverter. A pair of write transistors or gates 180-1 and 180-2 are connected to the pair of memory inverters 178. A pair of read transistors or gates 182 are also connected to the memory inverter pair 178-1,2. The gate terminals of the read transistors or gates 182-1 and 182-2 are connected to the corresponding word read line 104-1. The drain and source of the read gate 182-1 are connected to the input of inverter 178-2 and a bit line 106-1 respectively. The drain and source of the read gate 182-2 are connected to the output of the inverter 178-2 and a second bit line 106'-1 respectively.

Address decoders 187-1 through 187-M for rows 1-M, respectively, of the RAM each have a corresponding read decoder 116-1 through M and a write decoder 186-1 through M. As for FIG. 1, the output of each decoder 116-1 through M is connected to a corresponding word read line 104. Thus, when the output of a decoder 116-1 through M goes to a logic 1 during a memory read, the high or logic 1 is transmitted along the corresponding word line 104-1 through M which enables or turns on the corresponding read gates 182 in each memory cell in the corresponding row of memory cells of the RAM. Each enabled read gate allows a signal representing the data stored within the corresponding memory cell to be an output from inverters 178-1 and 178-2 onto bit lines 106-1 and 106'-1, respectively. Bit lines 106-1 and 106'-1 form a differential input to sense amp 108'-1. Thus, when the read decoder 116 enables the read gates 182-1,2 in memory cell 102-1,1 signals representing the stored data are transmitted down the bit lines 106-1, 106'-1 and converted to a logic level representing the data on line 50-1 by the sense amp 108'-1.

The precharge pulse generator 110-1 for column 1 receives the precharge pulse output 216 from the tracking precharge pulse generator 112. The output 216 is an input to the gate terminal of three precharger transistors 250-1,2,3. Precharge transistor 250-1 has its drain and source connected to an intermediate voltage supply 252 and the read bit line 106-1, respectively. Precharge transistor 250-2 has its drain and source connected to the same intermediate voltage supply 252 and the read bit line 106'-1 respectively. The third precharge transistor 250-3 has its source and drain connecting the read bit lines 106-1 and 106'-1, respectively. During precharging, the precharge pulse in output 216 is a logic 0 and enables the precharge transistors 250-1,2,3 on. When enabled, the precharge transistors 250-1 and 250-2 apply an intermediate voltage from the intermediate voltage supply 252 onto the read bit lines 106-1 and 106'-1 of column 1. With the differential memory cell system, the voltage on the two read bit lines is identical. When the precharge transistor 250 is enabled, the two read bit lines 106-1, 106'-1 are electrically connected together, thereby ensuring that the voltage level on both read bit lines is identical. At the end of precharging, the logic level of the output 216 disables the precharge transistors 250, thereby disconnecting the intermediate voltage supply 252 from the bit lines and disconnecting the two read bit lines from each other. The memory system is designed so that the read address decoding enables one of word lines 104-1 through M substantially coincident with the end of the precharge pulse. As a result, the voltage on the read bit lines for each column of memory cells in that one row changes from the intermediate voltage level to a voltage level representative of the bit of information in the corresponding RAM cell 102.

The write circuitry of the memory operates in a similar but reversed manner of the read circuitry. The write circuitry illustrated in FIG. 3 is not shown in FIG. 1 for clarity. Consider the write circuitry for cell 102-1,1 which is the same as the other memory cells. Write gates 180-1,2 are connected in a manner similar to the read gates 182-2,1. Each row 1 through M of RAM cells is interconnected by a corresponding write word line 184-1 through 184-M, respectively. The gate terminals of the write gates 180-1 and 180-2 in each memory cell of rows 1 through M are connected to the corresponding write word line 184-1 through 184-M, respectively. One of write decoders 186-1 through 186-M provides an enable signal along the corresponding one of write word lines 184-1 through 184-M, respectively, to the write gates 180-1,2 in the corresponding row of memory cells. A pair of write bit lines 188-1, 188'-1 interconnect each of the Ram cells in column 1. The write bit lines are differentially driven by write amp 190-1. The gate of write gate 180-1 in each memory cell of column 1 is connected to bit line 188-1. The drain of write gate 180-2 in each memory cell of column 1 is connected to the write bit line 188'-1. During a write, the address is decoded causing one of the write decoders 186-1 through 186-M to enable the write gates 180-1,2 in the corresponding row of memory cells. Simultaneously, a signal representing 1 bit of information is sent from the write amp 190 onto the write bit lines 188 and 188-2 and through the write gates 180-1 and 180-2 to set the memory inverters 178 to the proper condition representing that bit of information. Although only one column of memory cells and associated write bit lines 188, and write amp 190 have been shown it will be understood that there is another pair of write bit lines 188-2, 188'-2 through 188-M, 188'-N (not shown) connected to the outputs of other write amps 190-2 through 190-N (not shown), respectively, and connected to the memory cells in each of columns 2 through N, respectively, and another pair of read bit lines 106-1, 106'-1 through 106-N, 106'-N, respectively, connected to read amps 188'-2 through 108'-N, respectively, and connected to the memory cells in each of rows 2 through N, respectively, in the RAM. The construction and operation is essentially the same as that described above for column 1.

Figure 4:
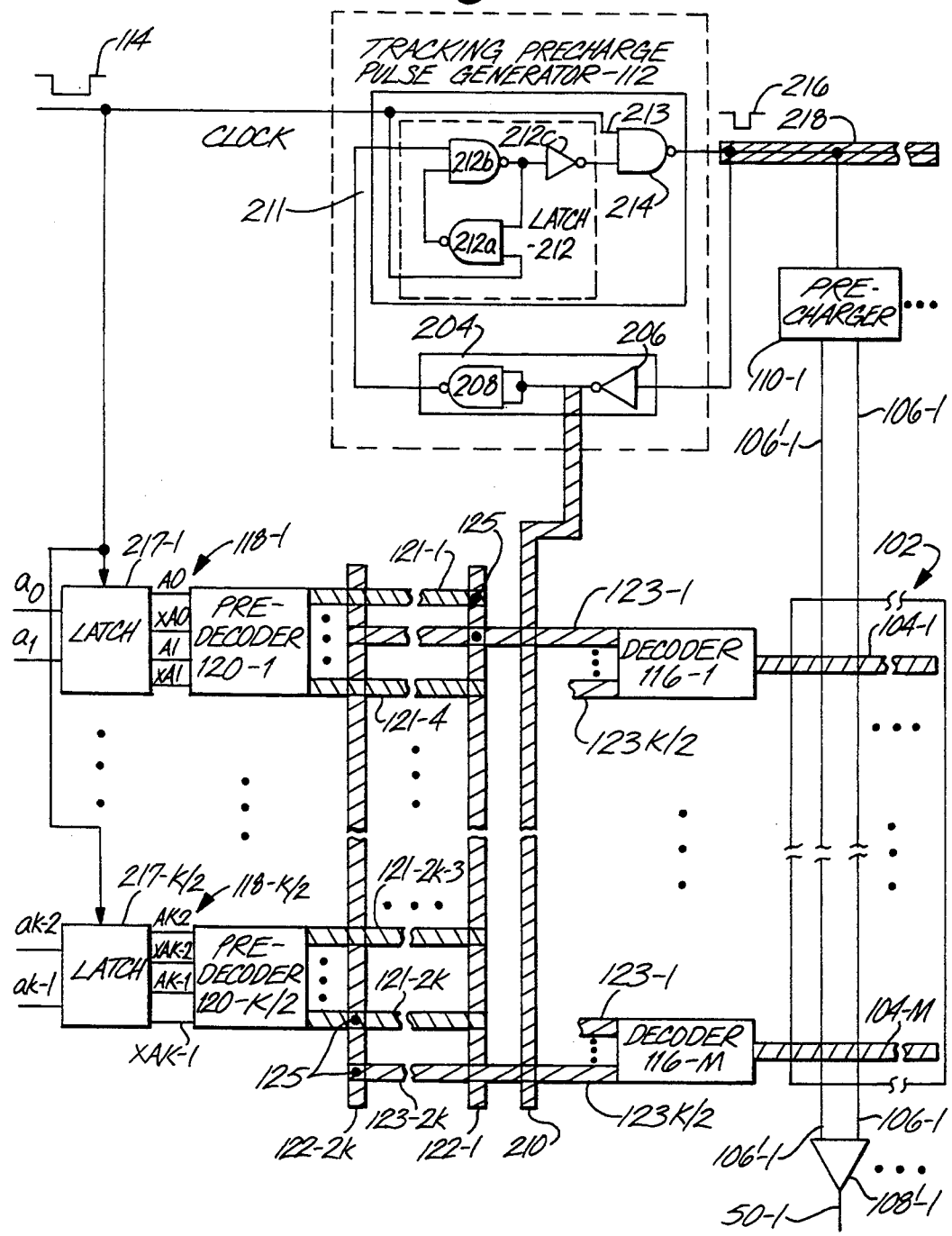
FIG. 4 is a schematic showing details of a preferred tracking precharge pulse generator, decoders and physical layouts of drive lines and a dummy load line for the static RAM memory.
Figure 5:
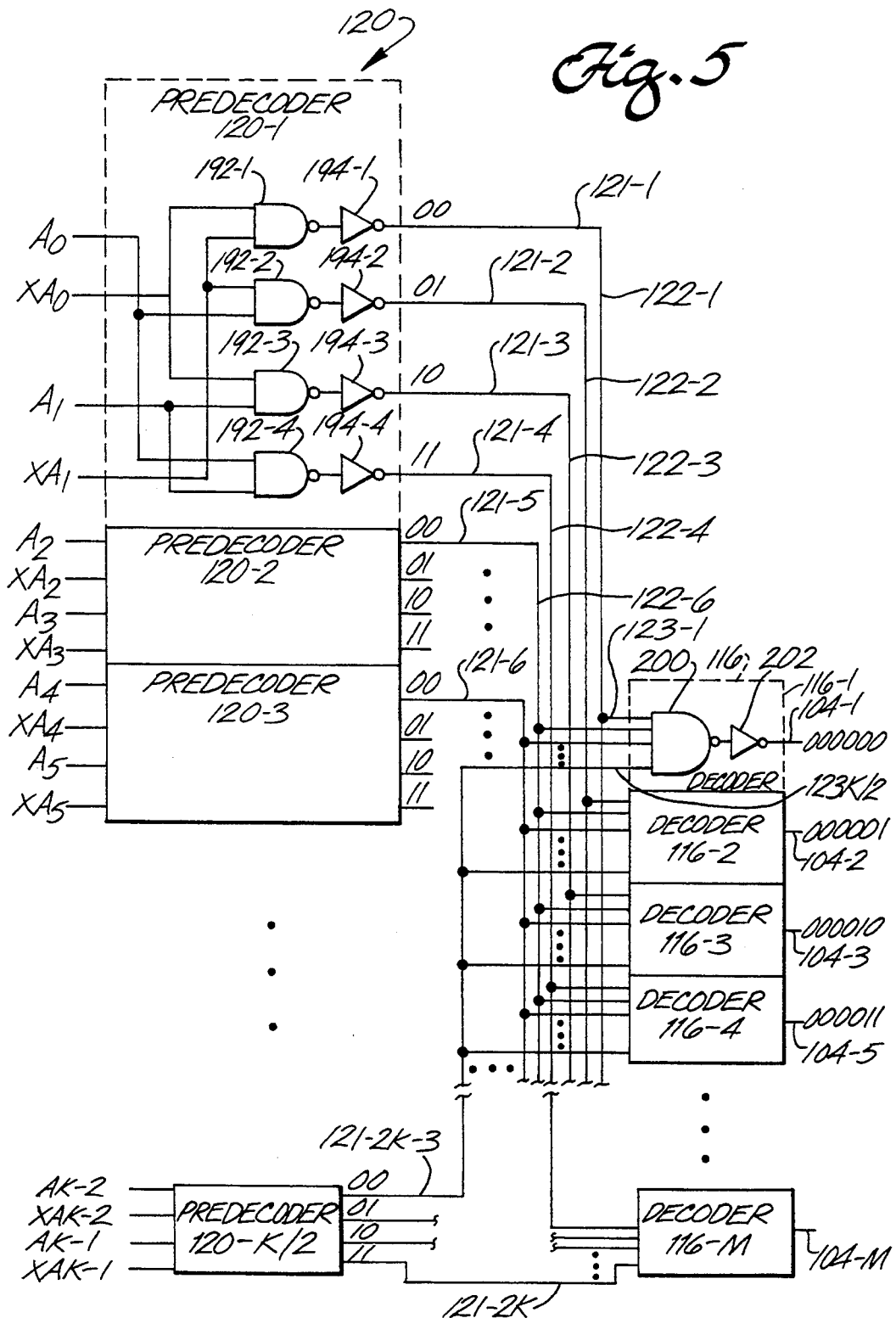
FIG. 5 is a schematic of predecoders and decoders making up the address decoders and the drive lines for the static RAM.

Refer now to FIGS. 4 and 5 and consider the way in which the addressing is handled in the RAM. The address includes bits A0 through AK-1 where K is the number of bits in the address. Since the address can be quite large, the decoding is split up between predecoders 120-1 through 120-K/2 and decoders 116-1 through 116-M for economy in both size and speed. For a memory with M rows, the relationship between the bits of the address and the rows of the memory can be expressed as $K = \log_2 M$. Predecoders 120-1 through 120-K/2 receives address bit pairs A0 A1 through AK-2 AK-1, respectively, and their inverted or complimented bits XA0 XA1 through XAK-2 XAK-1, respectively, from latches 217-1 through 217-K/2, respectively. The NAND GATES 192-1 through 192-4 of each predecoder receive the corresponding address bit pairs and the two inverted address bit pairs from the latches 217-1 through 217-K/2 and apply an output signal through a corresponding one of the inverters 194-1 through 194-4 to form an output signal on one of four horizontal predecoder drive lines connected to the predecoder. By way of example, the inverters 194 in each of the predecoders 120-1 through 120-K/2 are each connected to horizontal drive lines 121-1 through 121-2K, respectively. Each of horizontal drive lines 121-1 through 121-2K is, in turn, connected to a corresponding one of vertical predecoder drive lines 122-1 through 122-2K, respectively. Each decoder 116-1 through 116-M has a NAND GATE 200 connected through an inverter 202 to the corresponding one of memory read lines 104-1 through 104-M. The inputs of NAND GATE 200 in each of decoders 116-1 through 116-M is connected to one of the outputs of each of the predecoders 120-1 through 120-K/2. The connection is such that for each different unique address formed by address bits A0 through AK-1, only one of the memory read lines 104-1 through 104-M is enabled by a read signal. To this end, each NAND GATE 200 has K/2 inputs 123-1 through 123-K/2, each of which is connected to a different one of vertical predecoder drive lines 122-1 through 122-2K. For clarity, only predecoders 120-1 through 120-3 and 120-K/2 and decoders 116-1 through 116-4 and 116-M are shown, the other being indicated by dots.

Refer now to FIG. 4. As depicted in FIG. 4, the horizontal predecoder drive lines 121-1 through 121-2K, horizontal predecoder lines 123-1 through 123-2K and the horizontal word lines 104-1 through 104-M are each formed as parallel metal traces on a common integrated circuit silicon chip. The vertical predecoder drive lines 122-1 through 122-2K and a dummy drive line 210 (to be discussed) are formed as parallel metal traces on the same integrated circuit silicon chip. Horizontal pulse generator drive line 218 is a metal trace on the same semiconductor chip and is substantially the same length and width as and parallel with the memory read lines 104. All of the horizontal metal traces are at one level and all of the vertical traces are at a second level on the chip, separated by a layer of silicon oxide, which electrically insulates the two layers from each other. Connections between the vertical traces 121-1 through 121-2K and the corresponding horizontal traces 123-1 through 123-2K are formed by drilled metal filled holes indicated by dots 125 at the intersection of the traces, by way of example.

As illustrated in FIG. 4, clock signal 114 is applied to the tracking precharge pulse generator 112 and to each of address latches 217-1 through 217-K/2, which latches in turn are connected to the input of predecoders 120-1 through 120-K/2, respectively. Each of latches 217-1 through 217-K/2 receives pairs of address bits a0 a1 through aK-2 aK-1, respectively, to form the address bits A0 A1 through AK-2 AK-1, respectively to the predecoders 120-1 through 120-K/2, respectively. The latches 217-1 through 217-K/2 are D-type latch circuits which are responsive to high or logic 1 level of the clock for passing the address bit through to the input of the predecoder and responsive to a low or logic 0 clock 114 for latching in and holding the address represented by the bits a0 through aK-7 and until the clock again goes high to a logic 1.

The tracking precharge pulse generator 112, together with the dummy load line 210, mimic the latches 217-1 through 217-K/2, predecoders 120-1 through 120-K/2, the input load of decoders 116-1 through 116-M and the loads represented by the vertical predecoder lines 122-1 through 22-2K.

More specifically, tracking precharge pulse generator 12 includes a mimic predecoder 204 connected to dummy line 210. The mimic predecoder 204 has a predecoder inverter 206 connected to a mimic predecoder NAND GATE 208. The mimic predecoder inverter and the mimic predecoder NAND GATE are constructed on the same integrated circuit chip and contain essentially the same circuit as that employed in each inverter 194 and each NAND GATE 192 in the predecoders 120 (FIG. 5). Dummy load line 210 is connected to the output of the mimic predecoder inverter 206 and adds a load on the output of the inverter 206 similar to that formed on inverter 194 in each of the predecoders by the vertical drive lines 122-1 through 122-2K. The dummy load line 210 is essentially the same length as and substantially the same width as each of predecoder drive lines 122-1 through 122-2K and, therefore, presents essentially the same capacitance load to the inverter to which each is connected. This causes the mimic predecoder 204, including its dummy load 210, to mimic the operation of each predecoder and its corresponding vertical drive line.

Each vertical drive line 121 and the connected decoders, add a capacitive load to the corresponding inverter 194 which would effect the delay through the inverter. To simulate this effect, the dummy load line 210 is made slightly wider than the predecoder drive lines so that it has an equivalent capacitance per unit length essentially equal to that formed on the vertical predecoder drive lines. For example, the predecoder drive line may have a 0.01 inch width and a capacitance of 0.1 pF per 0.1 inches of length and a decoder may be positioned every 0.05 inches along the predecoder drive line length. Each decoder input has a 0.01 pF capacitance. Thus, the combined capacitance of the decoder and the metal is in the order of 0.12 pF per 0.1 inches. To achieve an equivalent dummy load line with an equivalent capacitance per length, a metal 0.012 inches in width provides a capacitance of about 0.12 pF per 0.1 inch.

In the tracking precharge pulse generator 112, the order of the chain of the mimic predecoder inverter 206 and the mimic predecoder NAND GATE 208 are reversed to the order of the NAND GATE 192 and inverter 194 in the predecoders because the signal propagating through the delay path needs to track on or follow the rising edge of the address signal out of the predecoder. Since the output of the pulse generator 112 switches from high to low, the inverter must be placed before the NAND GATE to create a rising edge during the delay pulse generation.

The tracking precharge pulse generator 112 includes a latch 212. The latch 213 is a set reset (SR) type latch having two input NAND GATES 212a, 212b, with the output of each connected to one input of the other and with the output of NAND GATE 212b connected to the input of an inverter 212c. A clock 114 is applied to the other input of the NAND GATE 212a and to one input of a output NAND GATE 214 whose second input is connected to the output of the inverter 212c. The output of the NAND GATE 214 is connected to the input of inverter 206 of the mimic predecoder 204.

The mimic latch 212 is logically and has delay characteristics essentially the same as each latch in latches 217-1 through 217-K/2.

When clock 114 goes low to a logic 0, the address bits applied to latches 219-1 through 219-K/2 are latched or held into the latches and simultaneously the mimic latch 212 is set to its opposite state and enables NAND GATE 214 to form a low or logic 0 output signal 216. The logic 1 signal 216 propagates along precharge line 218 to each of the prechargers 110-1 through 110-N and propagates through the mimic predecoder 204 where it resets the latch 212 to its initial state. When the latch is reset, the signal from the inverter 212c forces the NAND GATE 214 to terminate the logic 0 signal.

Because the pulse generator drive line 218 has similar delay characteristics to the word lines, the pulse-generator drive line mimics the word lines. As the output signal 216 propagates down the pulse generator drive line to each successive precharger 110, the delay characteristic is substantially identical to that of the address decode signal from the address decoder 116 as it propagates along a word line 104 to successive columns of RAM cells. Thus, for each column in the memory the precharge signal on the corresponding bit line occurs substantially coincident with the address signal for the corresponding RAM cell.

Figure 6:
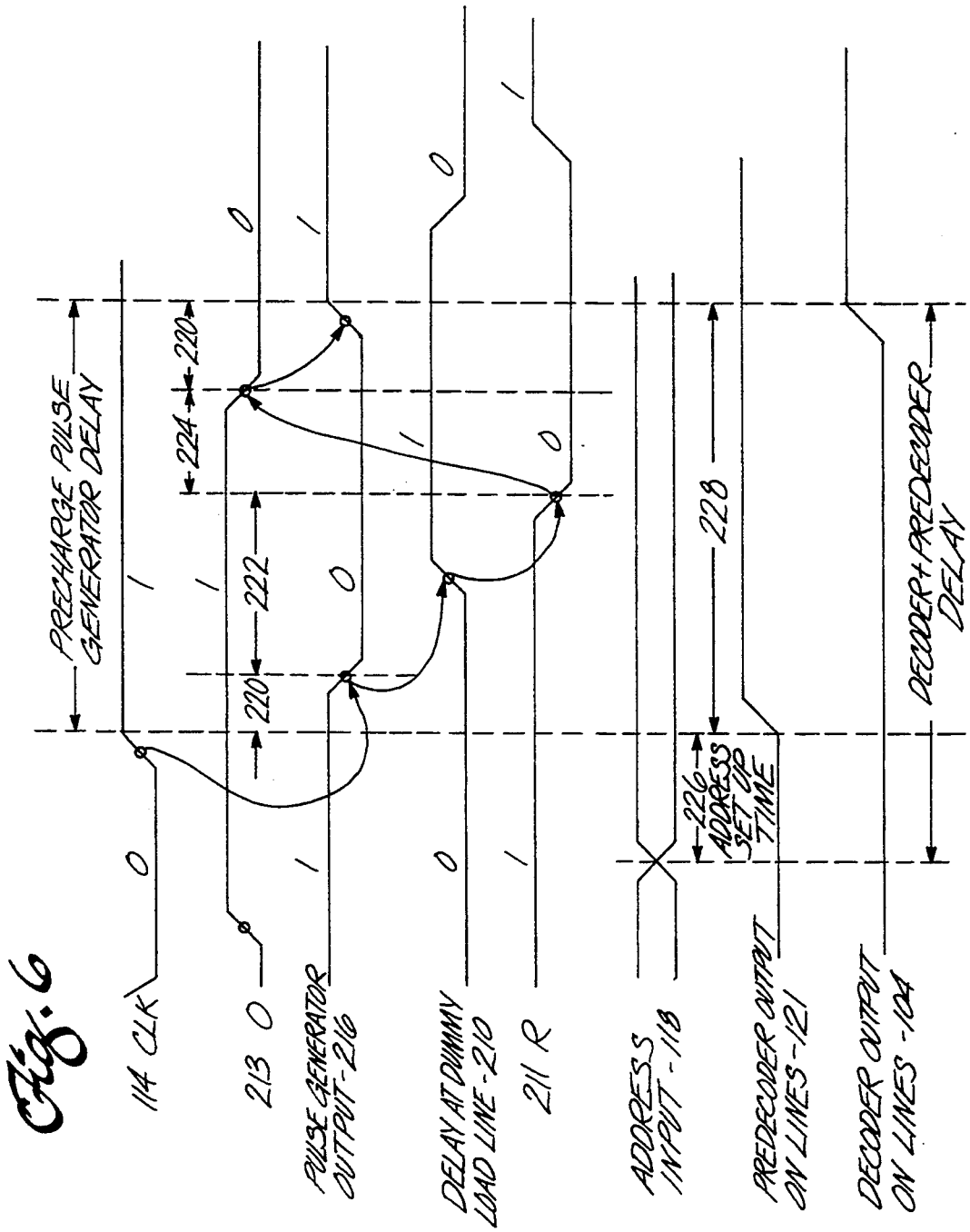
FIG. 6 shows timing wave forms of the tracking precharge pulse generator and the address decoder for the static RAM.

The timing diagram of the generation of the precharge pulse and the address decoding is shown in FIG. 6. After the clock 114 becomes a logic 1, the output 216 of the pulse generator NAND GATE 214 becomes a logic 0 after the delay time 220 through the NAND GATE. The pulse generator output 216, in addition to traveling to the prechargers 110, also propagates through the mimic predecoder 204 is inverted and by inverter 206 and a second time by NAND GATE 208 and after delay time 222 appears on reset line 211 as a transition from logic 1 to logic 0. This resets the mimic latch 212. After the latch time delay 224, the output 213 from the mimic latch goes from a logic 1 to logic 0. After the delay time 220 of the pulse generator NAND GATE 214, the output of this NAND GATE switches to a logic 1.

It is necessary that the logic 0 to 1 transition from the pulse generator output occur at the same time that the decoders 116-1 enable the next addressed memory row to be read in order to properly read the data signals on read bit lines from the memory cells. Thus, the time from the new address being selected to the address being read, which is the sum of predecoder delay and the decoder delay, must equal the address set up time 226, plus the precharge pulse generator delay 228. As defined above, the precharge pulse generator delay equals twice the delay through the pulse generator NAND GATE plus the SR latch delay plus the mimicked predecoder delay. All the elements in these equations are designed as part of the address decoding, except for the pulse generator NAND GATE 214. Thus, the two timing relationships have one unknown. Solving these equations, the pulse generator NAND GATE delay 220 equals one-half of the difference of the decoder delay minus the sum of the address set up time 226 and the SR latch delay 224. In typical configurations with present technology, the SR latch delay is small compared to the decoder delay. Thus, as a first approximation, the pulse generator NAND GATE delay is one half of the difference of the decoder delay and the address set up time.

The NAND GATE 214 in the tracking pulse generator circuit 112 is designed so that its delay characteristics track or mimic the delay characteristics of the NAND GATE 200 and inverter or driver 202 of the decoder 116-1 for variations in power supply voltage to the circuits, loading on the circuits, temperature variations on the circuits, and manufacturing process variations using a simulation computer program, such as HSPICE marketed by Meta Software and described in the HSPICE H9007B Users Manual, dated July 1991, published by Meta Software, the contents of which are incorporated by reference herein.

Figure 7:
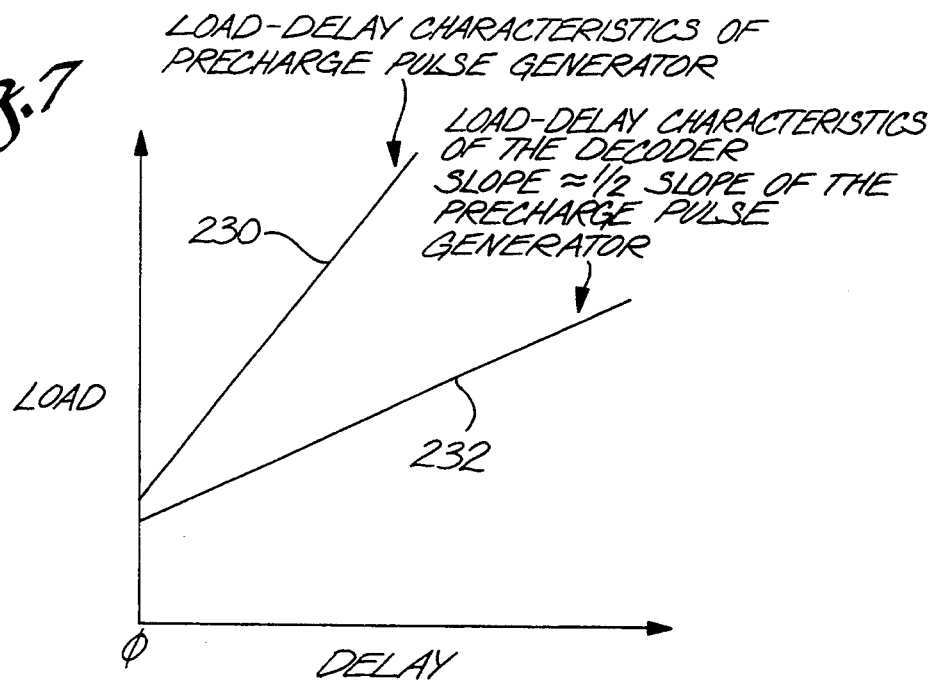
FIG. 7 shows load-delay characteristics of the tracking precharge pulse generator and the decoder for the static RAM.

FIG. 7 shows the load-delay characteristics of the precharge pulse generator NAND GATE and the decoder. As the load on the decoder increases, the delay time through the decoder also increases. However, because the pulse generator NAND GATE 214 must have a delay one-half that of the NAND GATE 200, the slope of the curve 230 is one-half that of the load delay characteristics curve 232 of the decoder. Designing a NAND GATE for defined load delay characteristics is well known to those skilled in the art. One method of doing this design is an empirical design by utilizing SPICE simulation.

Figure 4A:
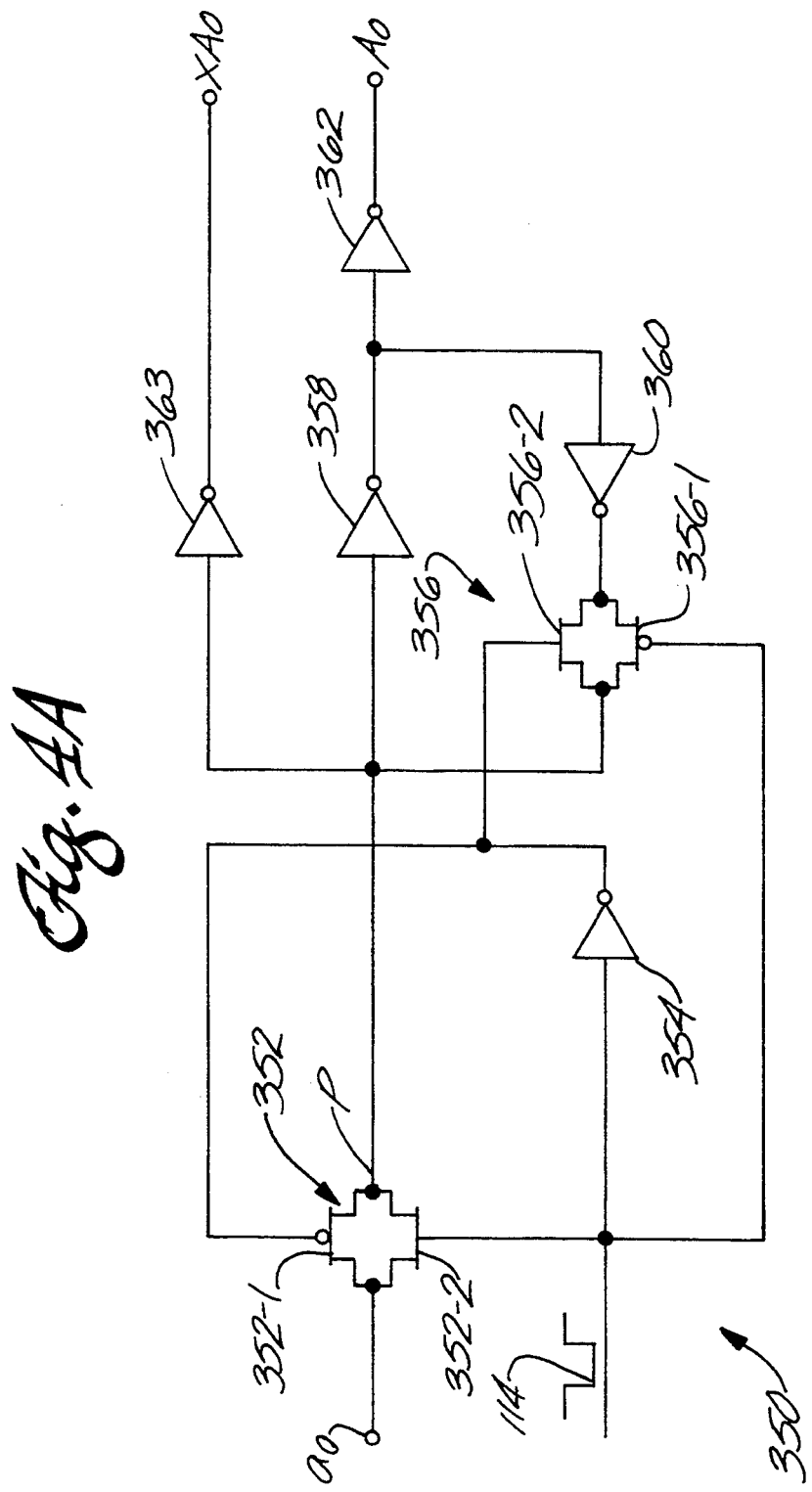
FIG. 4A is a schematic diagram of the latch for each address bit in latches 217-1 through 217-K/2.

FIG. 4A is a detailed schematic of the latches 217-1 through 217-K/2 (FIG. 4). Each latch 217 has two latch circuits 350, one for each of the pairs of address bits. For clarity, FIG. 4A shows the latch circuit 350 for one address bit, in particular address bit a0. However, the latch circuit for each address bit is identical.

The address bit a0 is connected to transmission gate 352. The transmission gate has a PMOS transistor 352-1 and an NMOS transistor 352-1. The drains of the PMOS transistor 352-1 and the NMOS transistor 352-2 are connected to each other and to the input address bit a0. The sources of the PMOS transistor 352-1 and the NMOS transistor 352-2 are similarly connected to each other at a point P. The gate of the NMOS transistor 352-2 is connected to the clock 114. The clock 114 is also an input to an inverter 354 whose output is connected to the gate of the PMOS transistor 352-1.

A second transmission gate 356 has a PMOS transistor 356-1 and an NMOS transistor 356-1. The drains of the PMOS transistor 356-1 and the NMOS transistor 356-2 are connected to each other and to point P. The sources of the PMOS transistor 356-1 and the NMOS transistor 356-2 are similarly connected to each other. The gate of the NMOS transistor 356-2 is connected to the output of the inverter 354. The gate of the PMOS transistor 356-1 is connected to the clock 114.

An inverter 358 has its input connected to point P and its output connected to the input of an inverter 360 and an inverter 362. The output of the inverter 360 is connected to the sources of the PMOS transistor 356-1 and the NMOS transistor 356-2.

As will be discussed below, when the transmission gate 356 is enabled, the inverters 358 and 360 function as a latch similar to the memory inverters 178. The output of the inverter 362 is connected to the address input of the predecoder 120. For address bit a0, the output of the inverter 362 is connected to A0 input of predecoder 120-1. The input of an inverter 363 is connected to point P and its output is address bit XA0 for address bit a0.

When the clock 114 goes to a logic 1, the NMOS transistor 352-2 is enabled by the clock and the PMOS transistor 352-1 is enabled by the inverted clock from the inverter 354. The logic state of the address bit propagates through the transmission gate 352 and the two inverters 358 and 362 which forms address bits A0 for predecoder 120-1. The inverter 363 forms the inverted or complimented address bit XA0. The inverted output of inverter 358 also propagates through inverter 360 to transmission gate 356. When the clock 114 is a logic 1, the transmission gate is disabled because the logic 1 disables the PMOS transistor 356-1 and the inverted clock from the inverter 354 disables the clock NMOS transistor 356-2.

When the clock 114 goes to a logic 0, the NMOS transistor 352-2 is disabled by the clock and the PMOS transistor 352-1 is disabled by the inverted clock from the inverter 354. This disables the transmission gate 352. Changes in the address bit a0 to transmission gate 352 will not propagate into the latch. The PMOS transistor 356-2 and the NMOS transistor 356-1 are enabled by the clock 114 and the inverted clock signal from the inverter 354, respectively. The transmission gate 356 is enabled and the output of the inverter 360 propagates through the transmission gate 356 and latches in the loop of the inverters 358 and 360 holding the state corresponding to the value of address bit a0.

Referring to FIG. 4, the NAND GATE 212b of the mimic latch 212 mimics, or has substantially the same delay characteristics as, the transmission gate 352 and the inverter 358. The inverter 212c of the mimic latch 212 mimics, or has substantially the same delay characteristic as, the inverter 362. The NAND GATE 212b is not identical to the transmission gate 352 and the inverter 358, because for CMOS applications the delay through the latch is approximately 0.3 nanoseconds (ns) which is much less than the delay through the decoders which is approximately 2.0 ns. Across normal process and temperature variations experienced by the RAM, the total delay of the decoders varies from 2.3 ns to 3.9 ns. However, the delay within the latch 217 tracks that within 0.15 ms. Thus, the delay changes from the latch do not need to be identical. However, for applications where the delay of the latch becomes significant, the NAND GATE 212b can be replaced by a circuit that more closely mimics the latch.

In the preferred embodiment disclosed the memory and related circuits disclosed in FIGS. 1 and 3, 4, 4A and 5 are all formed on a common metal oxide semiconductor (MOS) using complimentary MOS, i.e., CMOS, semiconductors.

Figure 8:
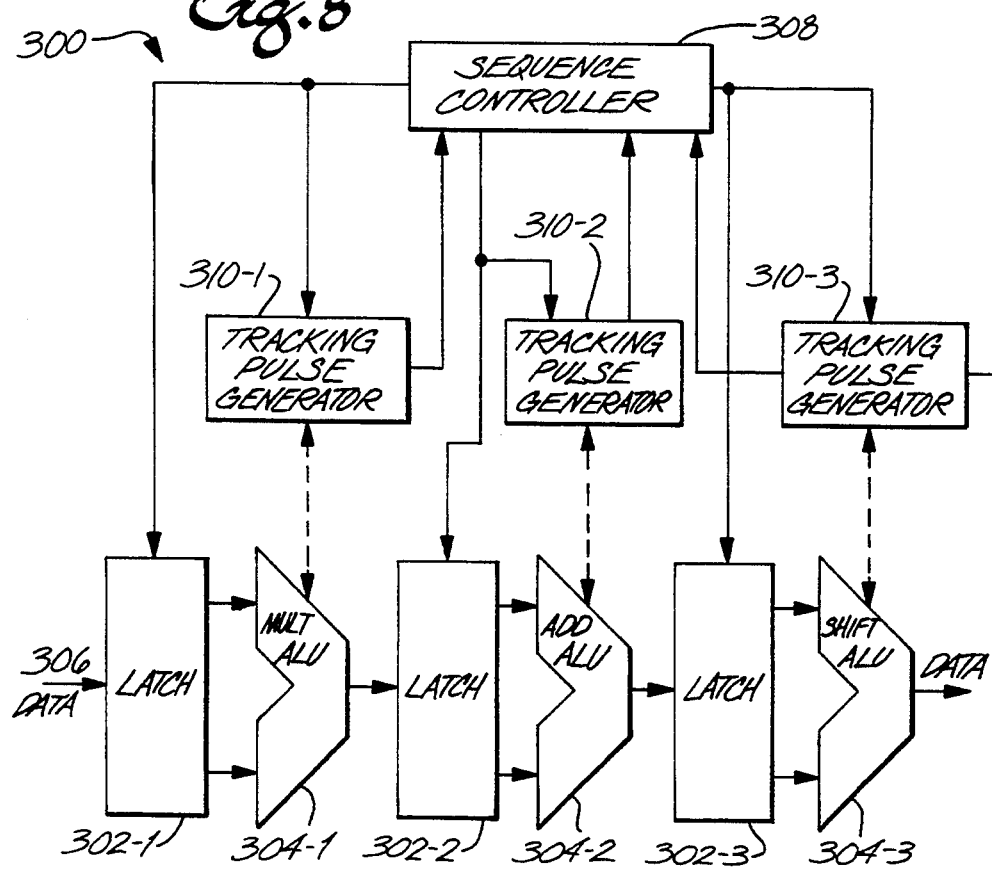
FIG. 8 shows a block diagram showing a pipeline computer using tracking pulse generators and embodying the present invention.
Figure 9A:
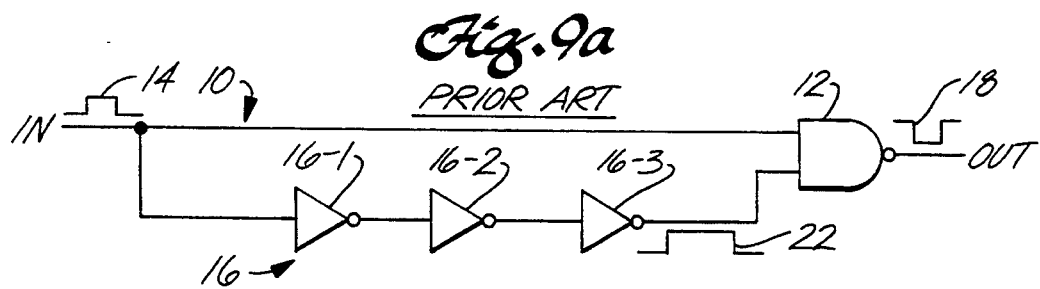
FIG. 9A is a schematic of a prior art chopper circuit.
Figure 9B:
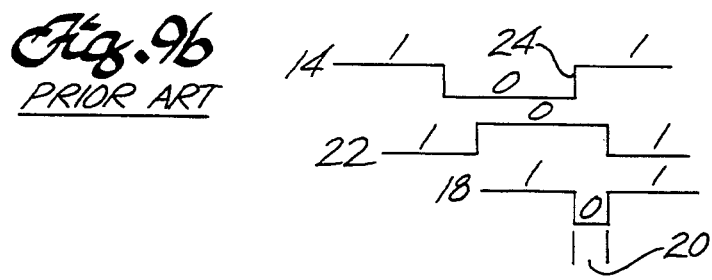
FIG. 9B are timing wave forms for the circuit of FIG. 9A.

FIG. 8 shows an embodiment for a tracking pulse generator in a pipeline computer. The pipeline computer 300 has a series of latches 302 and arithmetic logic units (ALU) 304. Data 306 is input into a latch 302-1. The data is output from the latch 302-1 into an ALU 304-1. A sequence controller 308 controls the timing of the latches 302. When the sequence controller 308 sends an enable signal to the latch, the data 306 gets loaded into the latch and is held while the ALU 304-1 processes the data. In a pipeline architecture, the output of the ALU 304-1 is input into a latch 302-2. In a manner similar to the latch 302-1, the sequence controller 308 controls the timing of the latch 302-2. The data from the ALU 304-1 is held in the latch 302-2 until an ALU 304-2 processes the data. Similarly, the data from ALU 304-2 is input into a latch 302-3 where it is held until an ALU 304-3 processes it. Concurrent with the loading of the data into the latches 302, the sequence controller 308 triggers a tracking pulse generator 310. Each ALU 304-x has a corresponding tracking pulse generator 310-x. Each tracking pulse generator is constructed using circuits which have substantially the same delay characteristics as the corresponding ALU with variations in temperature, process variables, power supply voltage and load. As a result, the time delay between the signal received by each tracking pulse generator and its output pulse will vary with the delay of the corresponding ALU. This causes the output pulse from each tracking pulse generator to always occur just before the corresponding ALU generates its output. Thus, as the ALU 304 processes the data, the tracking pulse generator 310 "measures" the time of this processing. The tracking pulse generator sends a signal to the sequence controller indicating that the ALU has finished processing the data so that the sequence controller can latch the data in the subsequent latch.

In a synchronous system, a clock signal shifts the data through each latch and ALU. However, by having the tracking pulse generator indicate the completion of the data processing in the ALU, the computer operates synchronously. The tracking pulse generator sends the completion signal before the data has been completely processed. The completion signal is sent in advance by the processing time of the sequence controller 308 to send a signal to the next latch 302 in response to the completion signal. Thus, the next latch 302 is activated simultaneously with the ALU 304 completing the processing of the data. Activating the next latch 302 is, however, delayed if the next ALU 304 has not processed its data.

By mimicking the circuits within the latch 302 and the ALU 304, the tracking pulse generator 310 tracks the delay characteristics of these circuits. Upon receipt of the trigger signal that the latch 302-x has been enabled, the tracking pulse generator 310-x enables its mimicking circuits and generates a pulse at a time that is earlier than the completion of the processing of the data in ALU 304-x by the processing time of the sequence controller.

A tracking pulse generator that mimics the delay of other circuits can also be used in other processors, e.g., parallel processors.

Having now described the invention in detail as required by the patent statutes, those skilled in the art will recognize modifications to the embodiments described herein for specific applications. Such modifications, including different memory types, different semiconductor technology, and different decoders, are within the scope and spirit of the invention as defined in the following claims.

Accordingly, the foregoing description should not be read as pertaining only to the precise structures and techniques described, but rather should be read consistent with, and as support for, the following claims, which are to have their fullest and fair scope.

What is claimed is:

1. A memory on a common integrated circuit chip comprising:
    a plurality of memory cells;
    a tracking pulse generator for applying and removing a precharge signal to the memory cells; and
    at least one decoder responsive to an initiating condition for applying a selection signal to the memory cells for thereby selecting memory cells for an operation, the at least one decoder being characterized in that it comprises a time delay characteristic between the time of the initiating condition and the time of the selection signal that may vary,
    the tracking pulse generator comprising a mimicking circuit responsive to the receipt of a synchronizing pulse for removing the precharge signal to the memory cells, the mimicking circuit being characterized for providing a time delay characteristic between the time of the occurrence of the synchronizing pulse and the time of the removal of the precharge signal which mimics the variation in time delay characteristic of the at least one decoder so that the removal of the precharge signal and the application of the selection signal will occur substantially coincidentally,
    a loading line on the integrated circuit chip coupled to the at least one decoder, and
    a load line on the same integrated circuit chip coupled to the mimicking circuit for loading the mimicking circuit substantially the same as the loading on the at least one decoder.

2. The memory of claim 1 wherein the integrated circuit chip is a CMOS integrated circuit chip.

3. The memory of claim 1 wherein the mimicking circuit substantially mimics the variations in time delay characteristic of the at least one decoder.

4. The memory of claim 1 wherein the mimicking circuit substantially mimics the variations in time delay characteristic of the at least one decoder with variations in temperature, supply voltage, loads and manufacturing processes of the at least one decoder.

5. A memory on a common integrated circuit chip comprising:
    a plurality of memory cells;
    a tracking pulse generator for applying and removing a precharge signal to the memory cells; and
    at least one decoder responsive to an initiating condition for applying a selection signal to the memory cells for thereby selecting memory cells for an operation, the decoder being characterized in that it comprises a time delay characteristic between the time of the initiating condition and the time of the selection signal that may vary,
    the tracking pulse generator comprising a mimicking circuit responsive to the receipt of a synchronizing pulse for removing the precharge signal to the memory cells, the mimicking circuit being characterized for providing a time delay characteristic between the time of the occurrence of the synchronizing pulse and the time of the removal of the precharge signal which mimics the variation in time delay characteristic of the at least one decoder so that the removal of the precharge signal and the application of the selection signal will occur substantially coincidentally, and
    wherein the at least one decoder comprises at least one predecoder and at least one second decoder for selecting memory cells in the memory, a first conductor on the same integrated circuit chip providing a predetermined load characteristic to the at least one predecoder and coupled to each of the second decoders and a second conductor on the same integrated circuit chip providing the same load characteristic as the first conductor to the mimicking circuit.

6. The memory of claim 5 wherein the first and second conductors are of substantially the same length.

7. The memory of claim 1 wherein the mimicking circuit comprises a gate and a feedback circuit coupled between an output of the gate and an input of the gate, the gate also having a second input coupled to the synchronizing pulse, the gate and feedback circuit being characterized for providing the precharge signal in response to the occurrence of the synchronizing signal.

8. An electrical circuit comprising a first circuit having an electrical load thereon and a delay characteristic which is a function of the load, and being responsive to an initiating signal for providing a first output signal delayed in time as a function of the delay characteristic, the electrical circuit further comprising a tracking pulse generator circuit for forming a second output signal in a predetermined time relationship with the first output signal after the occurrence of the initiating signal,
    the tracking pulse generator circuit comprising a gate and a feedback circuit coupled between an output of the gate at which the second signal is formed and an input of the gate, the gate also having an input coupled to the initiating signal, the gate and feedback circuit being characterized for generating the second output signal in response to the occurrence of the initiating signal, the gate and feedback circuit comprising an electrical load on the feedback circuit for mimicking the delay characteristic caused by the load on the first circuit, the gate and feedback circuit with such load thereby comprising a mimicking delay circuit which mimics the delay characteristic of the first circuit to thereby vary the delay in time of the second output signal as a function of the delay characteristic of the first circuit.

9. In an electrical circuit wherein a second output signal is to be formed in a predetermined time relationship with a first output signal after the occurrence of an initiating signal, the electrical circuit comprising:
    a first circuit having an output and an electrical load on the output, the electrical circuit being responsive to the initiating signal and having a delay characteristic which is a function at least of the load for providing the first output signal delayed in time as a function of the delay characteristic;
    a tracking pulse generator circuit comprising means for generating the second output signal and means for feeding back the second output signal to an input of the generating means;
    the generating means also comprising an input coupled to the initiating signal and a load on an output of the generating means, the generating means and the feedback means comprising means including the load for mimicking the delay characteristic of the first circuit to thereby vary the delay time between the occurrence of the initiating signal and the second output signal as a function of the delay characteristic of the first circuit.

* * * * *

UNITED STATES PATENT AND TRADEMARK OFFICE
CERTIFICATE OF CORRECTION

PATENT NO. : 5,386,150
DATED : January 31, 1995
INVENTOR(S) : Ryuji Yonemoto

It is certified that error appears in the above-indentified patent and that said Letters Patent is hereby corrected as shown below:

Column 3, line 58, change "cells" to -- cell --.

Column 4, line 40, change "completes" to -- is completed --.

Column 9, line 39, change "diagrams" to -- diagram --.

Column 9, line 42, change "signals" to -- signal --.

Column 10, line 3, change "Of delay" to -- of delay --.

Column 10, line 40, before "coincident" delete "in".

Column 10, line 61, change "circuits" to -- circuit --.

Column 12, line 16, after "250- 1, 2, 3" delete "on".

Column 14, line 31, after "through" change "22-2K" to -- 122-2K --.

Column 14, lines 63, 64, 67, change "inches" to -- inch -- (all occurrences).

UNITED STATES PATENT AND TRADEMARK OFFICE
CERTIFICATE OF CORRECTION

PATENT NO. : 5,386,150
DATED : January 31, 1995
INVENTOR(S) : Ryuji Yonemoto

It is certified that error appears in the above-indentified patent and that said Letters Patent is hereby corrected as shown below:

Column 15, line 1, change "inches" to -- inch --.

Column 15, line 23, before "output" change "a" to -- an --.

Column 15, line 27, after "logically" insert -- similar to --.

Column 15, line 60, after "predecoder 204" insert -- and --.

Column 17, line 61, after "tracks" delete "that".

Signed and Sealed this

Seventh Day of May, 1996

*Attest:*

BRUCE LEHMAN

*Attesting Officer*  *Commissioner of Patents and Trademarks*